United States Patent
You et al.

(10) Patent No.: US 7,297,620 B2
(45) Date of Patent: Nov. 20, 2007

(54) METHOD OF FORMING AN OXIDE LAYER INCLUDING INCREASING THE TEMPERATURE DURING OXIDATION

(75) Inventors: Young-Sub You, Pyungtak-si (KR); Hun-Hyeoung Leam, Yongin-si (KR); Seok-Woo Nam, Yongin-si (KR); Bong-Hyun Kim, Incheon-si (KR); Woong Lee, Seoul (KR); Sang-Hoon Lee, Euiwang-si (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 10/839,934

(22) Filed: May 6, 2004

(65) Prior Publication Data
US 2004/0224531 A1    Nov. 11, 2004

(30) Foreign Application Priority Data
May 9, 2003   (KR)   .................. 10-2003-0029446

(51) Int. Cl.
*H01L 21/3205* (2006.01)
*H01L 21/4763* (2006.01)
*H01L 21/31* (2006.01)
*H01L 21/469* (2006.01)

(52) U.S. Cl. ............... 438/585; 438/787; 438/788; 257/E21.275

(58) Field of Classification Search ............ 438/149, 438/585, 787, 788; 257/E21.275
See application file for complete search history.

(56) References Cited

U.S. PATENT DOCUMENTS

| 4,518,630 | A | * | 5/1985 | Grasser | ............... 438/774 |
|---|---|---|---|---|---|
| 4,785,337 | A | * | 11/1988 | Kenney | ............... 257/304 |
| 6,451,713 | B1 | | 9/2002 | Tay et al. | ............... 438/791 |
| 2001/0006842 | A1 | | 7/2001 | Hattori | ............... 438/584 |
| 2001/0006843 | A1 | | 7/2001 | Park | ............... 438/591 |
| 2002/0003258 | A1 | | 1/2002 | Keating et al. | ............... 257/336 |
| 2002/0098712 | A1 | * | 7/2002 | Mavoori et al. | ............... 438/771 |
| 2004/0121605 | A1 | * | 6/2004 | Maydan et al. | ............... 438/694 |

FOREIGN PATENT DOCUMENTS

KR     2000-39247     7/2000

OTHER PUBLICATIONS

Stanley Wolf Ph.D. and Richard N. Tauber Ph.D. in Silicon Processing for the VLSI Era, vol. 1: Process Technology, Lattice Press, 1986, p. 195.*

* cited by examiner

*Primary Examiner*—William M. Brewster
(74) *Attorney, Agent, or Firm*—Mills & Onello LLP

(57) ABSTRACT

In methods of forming an oxide layer and an oxynitride layer, a substrate is loaded into a reaction chamber having a first pressure and a first temperature. The oxide layer is formed on the substrate using a reaction gas while increasing a temperature of the reaction chamber from the first temperature to a second temperature under a second pressure. Additionally, the oxide layer is nitrified in the reaction chamber to form the oxynitride layer on the substrate. When the oxide layer and/or the oxynitride layer are formed on the substrate, minute patterns of a semiconductor device, for example a DRAM device, an SRAM device or an LOGIC device may be easily formed on the oxide layer or the oxynitride layer.

24 Claims, 12 Drawing Sheets

METHOD OF FORMING AN OXIDE LAYER INCLUDING INCREASING THE TEMPERATURE DURING OXIDATION

CROSS REFERENCE TO RELATED APPLICATION

This application claims priority under 35 USC § 119 to Korean Patent Application No. 2003-29446, filed on May 9, 2003, the contents of which are herein incorporated by reference in their entirety for all purposes.

BACKGROUND OF THE INVENTION

1. Field of the Invention

The present invention relates to a method of forming an oxide layer and a method of forming an oxynitride layer. More particularly, the present invention relates to a method of forming a very thin oxide layer having excellent uniformity and characteristics on a substrate using a batch type apparatus, and a method of forming a very thin oxynitride layer by nitrifying the oxide layer on the substrate.

2. Description of the Related Art

As information processing systems such as computers have been widely utilized, semiconductor devices also have been rapidly developed. Thus, semiconductor manufacturing technologies have improved to produce semiconductor devices having large storage capacity, high response speed, high integration degree, good reliability, etc.

As the design rule of the semiconductor device decreases, the sizes of patterns of the semiconductor device also greatly decrease. For example, in a metal oxide semiconductor (MOS) transistor, a gate insulation layer between a gate electrode and a substrate has exceedingly reduced thickness and width. Various semiconductor devices such as dynamic random access memory (DRAM) devices, static random access memory (SRAM) devices, or flash memory devices demand an oxide layer having a thickness of several tens of angstroms (Å) as a gate insulation layer. In particular, a logic device for driving a memory circuit requires an extremely thin oxide layer of about 10 Å as the gate insulation layer. Therefore, it is required to form a very thin oxide layer on a substrate as the gate insulation layer.

When the gate insulation layer of the semiconductor device is very thin, impurities doped in the gate electrode may diffuse into the substrate through the thin gate insulation layer. Hence, before forming the gate electrode on the gate insulation layer, an oxynitride layer may be formed on the gate insulation layer to prevent the impurities in the gate electrode from diffusing into the substrate.

In a conventional semiconductor manufacturing method, the very thin oxide or oxynitride layer is formed using a single type apparatus such as a rapid thermal processing (RTP) apparatus since the very thin oxide or oxynitride layer may not have a precisely controlled thickness and may have poor uniformity and quality when a batch type apparatus is used. Additionally, a native oxide layer may be formed on the very thin oxide layer when the oxide layer is formed using the batch type apparatus. On the other hand, the very thin oxide or oxynitride layer formed in the single type apparatus may have poor electrical characteristics because thermal damage may occur to the very thin oxide or oxynitride layer.

SUMMARY OF THE INVENTION

The present invention provides a method of forming a very thin oxide layer having greatly improved uniformity and electrical characteristics by oxidizing a substrate in a reaction chamber at a low pressure.

The present invention also provides a method of forming an oxynitride layer for effectively preventing impurities from diffusing into the substrate using a batch type apparatus.

The present invention also provides a method of forming an oxynitride layer for effectively preventing impurities from diffusing into the substrate using an RTN apparatus.

In accordance with one aspect of the present invention, there is provided a method of forming an oxide layer on a substrate. In accordance with the method, a substrate is loaded into a reaction chamber having a first pressure and a first temperature. The substrate is primarily oxidized by providing a reaction gas onto the substrate while increasing temperature of the reaction chamber from the first temperature to a second temperature under a second pressure.

The primarily oxidized substrate can be secondarily oxidized in the reaction chamber when the reaction chamber is at the second temperature and the second pressure. The secondarily oxidized substrate can be from the reaction chamber when the reaction chamber is at a third pressure and the second temperature.

The secondarily oxidized substrate can be cooled in the reaction chamber while decreasing the temperature of the reaction chamber from the second temperature to a third temperature under the second pressure, and the substrate can be unloaded from the reaction chamber.

Additionally, the primarily oxidized substrate can be cooled while decreasing the temperature of the reaction chamber from the second temperature to a third temperature under a third pressure, and the substrate can be unloaded from the reaction chamber. The third pressure can be greater than the second pressure. The third temperature can be greater than the first temperature. The temperature of the reaction chamber can be decreased from the second temperature to the third temperature at a rate of about 2 to about 15° C./minute. 12. The primarily oxidized substrate can be unloaded from the reaction chamber at the second temperature and a third pressure. The second temperature can be in a range of about 600 to about 750° C.

In one embodiment, the first pressure can be in a range of about 0.03 to about 3.0 Torr, and the first temperature can be in a range of about 300 to about 550° C. In addition, the second pressure can be in a range of about 0.3 to about 20 Torr, and the second temperature can be in a range of about 550 to about 950° C. The temperature of the reaction chamber can be increased from the first temperature to the second temperature at a rate of about 2 to about 15° C./minute. The reaction gas can include an oxygen gas ($O_2$), and further include a hydrogen gas ($H_2$) or a hydrogen chloride gas (HCl).

The primarily oxidized substrate can be nitrified in the reaction chamber when the reaction chamber is at the second pressure and the second temperature. In accordance with another aspect of the present invention, there is provided a method of forming an oxide layer on a substrate. In accordance with the method, a substrate is loaded into a reaction chamber having a first temperature. The substrate is primarily oxidized by providing a reaction gas onto the substrate while increasing a temperature of the reaction chamber from the first temperature to a second temperature under a pressure of about 0.3 to about 20 Torr. The primarily oxidized substrate can be secondarily oxidized in the reaction chamber when the reaction chamber is at the second temperature and the pressure.

In accordance with another aspect of the present invention, there is provided a method of forming an oxide layer on a substrate. In accordance with the method, a substrate is loaded into a reaction chamber having a first pressure and a first temperature. The substrate is primarily oxidized by providing a reaction gas including an oxygen gas and a hydrogen gas onto the substrate while increasing a temperature of the reaction chamber from the first temperature to a second temperature under a second pressure. The primarily oxidized substrate can be secondarily oxidized in the reaction chamber when the reaction chamber is at the second pressure and the second temperature.

In accordance with another aspect of the present invention, there is provided a method of forming an oxide layer. In accordance with the method, a substrate is loaded into a reaction chamber having a first pressure and a first temperature. The substrate is primarily oxidized by providing a first reaction gas including an oxygen gas and a hydrogen gas onto the substrate while increasing a temperature of the reaction chamber from the first temperature to a second temperature under a second pressure. The primarily oxidized substrate is secondarily oxidized by providing a second reaction gas including an oxygen gas onto the substrate while increasing the temperature of the reaction chamber from the second temperature to a third temperature under the second pressure.

Additionally, the secondarily oxidized substrate can be tertiarily oxidized in the reaction chamber when the reaction chamber is at the second pressure and a third temperature.

In one embodiment, the second reaction gs further includes a hydrogen chloride gas.

In accordance with another aspect of the present invention, there is provided a method of forming an oxynitride layer on a substrate. In accordance with the method, a substrate is loaded into a reaction chamber having a first pressure and a first temperature. The substrate is oxidized by providing a reaction gas onto the substrate while increasing a temperature of the reaction chamber from the first temperature to a second temperature under a second pressure. The oxidized substrate is nitrified in the reaction chamber when the reaction chamber is at the second pressure and the second temperature.

The substrate can be primarily oxidized by providing a first reaction gas including an oxygen gas and a hydrogen gas onto the substrate while increasing the temperature of the reaction chamber from the first temperature to a third temperature under the second pressure. The primarily oxidized substrate can be secondarily oxidized by providing a second reaction gas including an oxygen gas onto the substrate while increasing the temperature of the reaction chamber from the third temperature to the second temperature under the second pressure. The substrate can be nitrified using a gas including a nitrogen compound activated by a remote plasma process. The nitrogen compound can include nitrogen ($N_2$), nitrogen monoxide (NO) or dinitrogen monoxide ($N_2O$). The secondarily oxidized substrate can be tertiarily oxidized in the reaction chamber when the reaction chamber is at the second pressure and the second temperature.

In one embodiment, the second reaction gas further includes a hydrogen chloride gas.

In one embodiment, the first pressure is in a range of about 0.03 to about 3.0 Torr, and the first temperature is in a range of about 300 to about 550° C. The second pressure can be in a range of about 0.3 to about 20 Torr, and the second temperature can be in a range of about 550 to about 950° C. The temperature of the reaction chamber can be increased from the first temperature to the second temperature at a rate of about 2 to about 15° C./minute. In accordance with another aspect of the present invention, there is provided a method of forming an oxynitride layer on a substrate. In accordance with the method, a substrate is loaded into a reaction chamber having a first pressure and a first temperature. The substrate is oxidized by providing a reaction gas onto the substrate while increasing a temperature of the reaction chamber from the first temperature to a second temperature under a second pressure. The substrate is cooled in the reaction chamber while decreasing the temperature of the reaction chamber from the second temperature to a third temperature under the second pressure. The oxidized substrate is nitrified in the reaction chamber having the second pressure and the third temperature.

In one embodiment, oxidizing the substrate further comprises: primarily oxidizing the substrate by providing a first reaction gas including an oxygen gas and a hydrogen gas onto the substrate while increasing the temperature of the reaction chamber from the first temperature to a fourth temperature under the second pressure; and secondarily oxidizing the primarily oxidized substrate by providing a second reaction gas including an oxygen gas onto the substrate while increasing the temperature of the reaction chamber from the fourth temperature to the second temperature under the second pressure.

In one embodiment, the second reaction gas further comprises a hydrogen chloride gas.

In one embodiment, the temperature of the reaction chamber is decreased from the second temperature to the third temperature at a rate of about 2 to about 15° C./minute.

In one embodiment, the secondarily oxidized substrate is tertiarily oxidized in the reaction chamber when the reaction chamber is at the second pressure and the second temperature. In accordance with another aspect of the present invention, there is provided a method of forming an oxynitride layer on a substrate. In accordance with the method, the substrate is loaded into a reaction chamber having a first pressure and a first temperature. The substrate is oxidized by providing a reaction gas onto the substrate while increasing a temperature of the reaction chamber from the first temperature to a second temperature under a second pressure. The oxidized substrate is nitrified by providing a reaction gas onto the substrate while increasing the temperature of the reaction chamber from the second temperature to a third temperature under the second pressure.

In one embodiment, oxidizing the substrate further comprises: primarily oxidizing the substrate by providing a first reaction gas including an oxygen gas and a hydrogen gas onto the substrate while increasing the temperature of the reaction chamber from the first temperature to a fourth temperature under the second pressure; and secondarily oxidizing the primarily oxidized substrate by providing a second reaction gas including an oxygen gas onto the substrate while increasing the temperature of the reaction chamber from the fourth temperature to the second temperature under the second pressure.

In one embodiment, the second reaction gas further comprises a hydrogen chloride gas. In accordance with another aspect of the present invention, there is provided a method of forming an oxynitride layer on a substrate. In accordance with the method, the substrate is loaded into a first reaction chamber having a first pressure and a first temperature. The substrate is oxidized by providing a reaction gas onto the substrate while increasing a temperature of the first reaction chamber from the first temperature to a second temperature under a second pressure. The oxidized substrate is cooled in the first reaction chamber while decreasing the temperature of the first reaction chamber from the second temperature to a third temperature under the second pressure. The substrate is unloaded from the first reaction chamber. The oxidized substrate is loaded into a second reaction chamber. The oxidized substrate is nitrified by providing a reaction gas onto the substrate in the second reaction chamber.

Nitration of the oxidized substrate is carried out by providing the reaction gas including an ammonia gas in the second reaction chamber of a rapid thermal nitration (RTN) apparatus. The RTN apparatus can include a lamp heating device, a laser heating device, an electron beam heating device or an ion beam heating device.

In one embodiment, the second reaction gas further comprises a hydrogen chloride gas.

In one embodiment, the secondarily oxidized substrate is tertiarily oxidized in the first reaction chamber when the first reaction chamber is at the second temperature and the second pressure. According to the present invention, the oxide layer is formed on the substrate using a batch type apparatus, and the oxynitride layer is formed on the substrate using the RTN apparatus. Thus, the throughput of the process for forming the oxynitride layer can be increased and the oxynitride layer having a precise thickness can be obtained. In addition, when the oxide layer and/or the oxynitride layer are formed on the substrate, minute patterns of a semiconductor device, for example a DRAM device, an SRAM device or an LOGIC device can be easily formed on the oxide layer or the oxynitride layer. Further, the oxynitride layer prevents the diffusion of the impurities doped in the conductive layer of the semiconductor device, thereby improving the reliability of the semiconductor device.

BRIEF DESCRIPTION OF THE DRAWINGS

The above and other features and advantages of the present invention will become readily apparent by reference to the following detailed description when considered in conjunction with the accompanying drawings wherein: In the drawings, the thickness of layers and regions are exaggerated for clarity.

DESCRIPTION OF THE PREFERRED EMBODIMENTS

In the following detailed description, it will be understood that when an element such as a layer, region or substrate is referred to as being "on" or "onto" another element, it can be directly on the other element or intervening elements may also be present.

U.S. Patent Application Publication number 2002-3258 discloses a method of forming a gate insulation layer including a silicon oxynitride layer that is converted from a hydroxy-silicate layer by a nitration process after forming the hydroxy-silicate layer on a substrate. In this approach, the nitration process is carried out at a temperature of about 200 to about 500° C. and a pressure of about 1 to about 5 Torr to form the silicon oxynitride layer having a thickness of about 7 Å. However, since the nitration process is performed in a single type apparatus such as a rapid thermal nitration (RTN) apparatus, the throughput of the nitration process may be reduced and the characteristics of the silicon oxynitride layer may be deteriorated due to a thermal damage thereto.

Figure 1A:
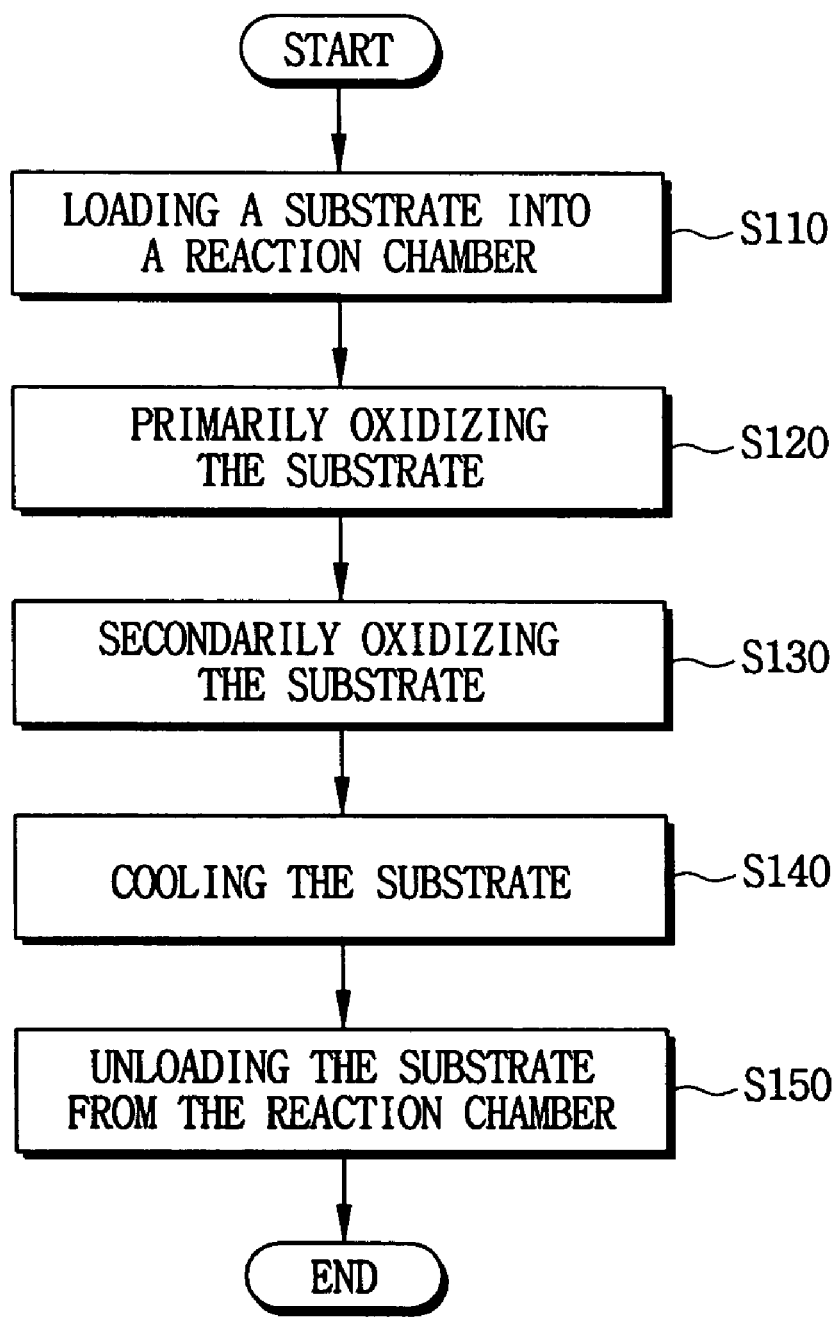
FIG. 1A is a flow chart illustrating a method of forming an oxide layer on a substrate in accordance with one embodiment of the present invention.

U.S. Patent Application Publication number 2001-6842 discloses a method of forming a tantalum oxynitride (TaON) layer as a gate insulation layer instead of the silicon oxynitride layer. This tantalum oxynitride layer has several advantages such as improved stability, relatively high breakdown voltage, low leakage current, etc. Particularly, after a silicon nitride layer or a silicon oxynitride layer is formed on a substrate including a field oxide layer at a temperature of about 200 to about 0.600° C. under a pressure of about 0.2 to about 10 Torr, a tantalum oxynitride layer is formed on the silicon nitride or a silicon oxynitride layer so as to form the gate insulation layer on the substrate. Here, the silicon nitride or silicon oxynitride layer is formed using an $NH_3$ gas, an $O_2$ gas or $NO_2$ gas. In addition, U.S. Pat. No. 6,451,713 discloses a method of forming an oxynitride layer having a thickness of about 6 to about 10 Å using a reaction gas excited by U.V. light. This oxynitride layer is formed at a temperature of about 800° C. and at a pressure of about 0.5 to about 500 Torr. However, the above-mentioned methods have poor throughput because the oxynitride layers are formed using a low pressure chemical vapor deposition (LPCVD) apparatus. FIG. 1A is a flow chart illustrating a method of forming an oxide layer on a substrate in accordance with one embodiment of the present invention.

Referring to FIG. 1A, in step S110, a substrate is loaded into a reaction chamber having a first temperature and a first pressure. The substrate is primarily oxidized while the first temperature of the reaction chamber is increased to a second temperature in step S120. Thus, a uniform primary oxide layer having a thickness of about 10 Å is formed on the substrate.

In step S130, the primary oxidized substrate may be secondarily oxidized when the reaction chamber is at the second temperature and a second pressure larger than the first pressure. As a result, the primary oxide layer on the substrate is grown to form a secondary oxide layer having a desired thickness on the substrate.

After forming the primary oxide layer or forming the secondary oxide layer, the substrate may be cooled in step S140 by decreasing the temperature of the reaction chamber. The cooled substrate is unloaded from the reaction chamber in step S150. In addition, the substrate may be unloaded from the reaction chamber in step S150 when the reaction chamber is at the second temperature.

Figure 1B:
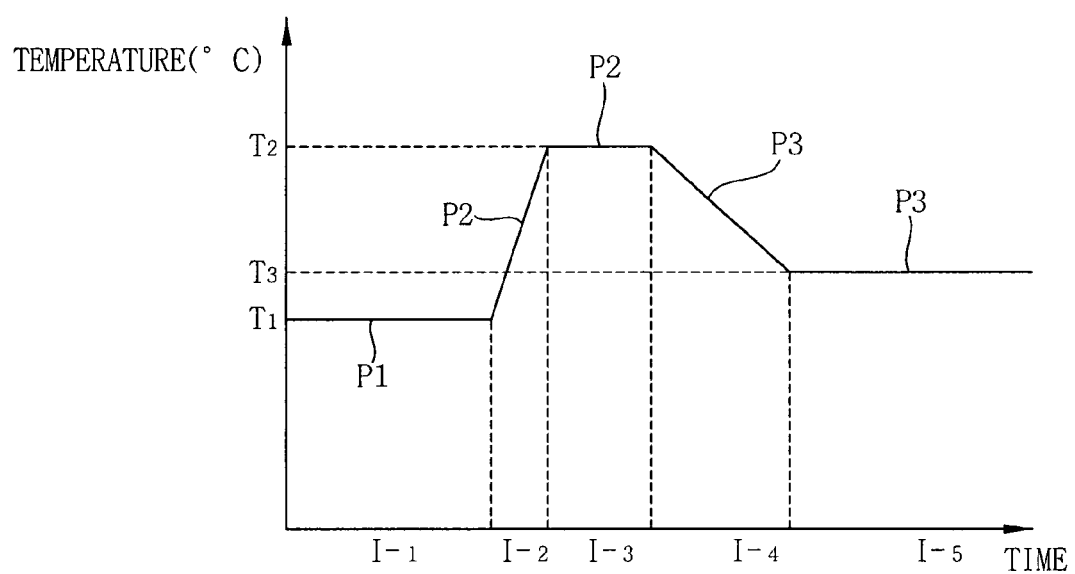
FIG. 1B is a timing diagram illustrating the method of forming the oxide layer on the substrate in accordance with one embodiment of the present invention.

FIG. 1B is a timing diagram illustrating the method of forming the oxide layer on the substrate in accordance with FIG. 1A.

Referring to FIGS. 1A and 1B, the substrate is loaded into a reaction chamber of a batch type apparatus in step I-1 (step S110). Here, the reaction chamber has a first temperature $T_1$ and a first pressure P1.

Figure 1C:
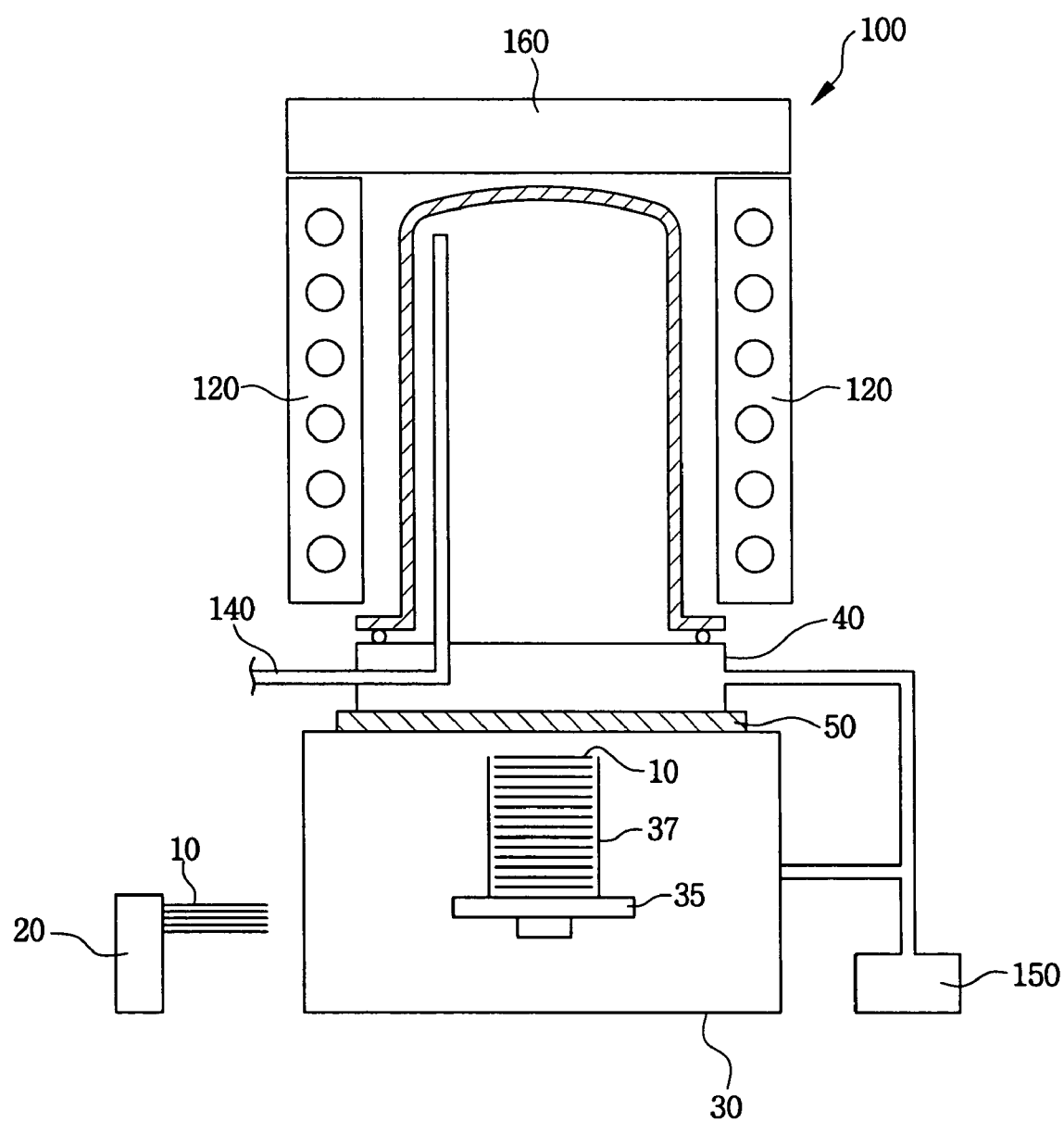
FIG. 1C is a cross-sectional view illustrating a reaction chamber for forming an oxide layer in accordance with one embodiment of the present invention.

FIG. 1C is a cross-sectional view illustrating a reaction chamber for forming an oxide layer in accordance with one embodiment of the present invention.

Referring to FIGS. 1B and 1C, a substrate 10 on which an oxide layer is formed is disposed on a boat 37 supported by a boat loader 35 of a load-lock chamber 30. The substrate 10 is placed on the boat 37 using a transferring member 20 such as a handler. The boat 37 may simultaneously load more than about 100 substrates 10 to improve the throughput of the process for forming the oxide layer.

In step I-1 (step S110), the pressure of the reaction chamber 100 and the load-lock chamber 30 is reduced to about 0.03 to about 3.0 Torr using a pressure control member 150 such as a vacuum pump. After a shutter 50 is opened, the boat 37 including the substrate 10 is loaded into the reaction chamber 100 in accordance with the movement of the boat loader 35.

Although the load-lock chamber 30 is separated from the reaction chamber 100, the load-lock chamber 30 has a constant pressure of about 0.03 to 3.0 Torr while the shutter 50 is opened and the substrate 10 is transferred into the reaction chamber 100 because the pressure control member 150 maintains the pressure of the load-lock chamber 30 and the reaction chamber 100.

Before oxidizing the substrate 10, the reaction chamber 100 is at the first pressure P1 about 0.03 to about 3.0 Torr and the first temperature $T_1$ of about 300 to about 500° C. When the reaction chamber 100 has the first pressure P1 of about 0.03 to about 3.0 Torr before oxidizing the substrate 10, a native oxide layer may not be formed on the substrate 10. It is difficult to reduce the pressure of the reaction chamber 100 to below about 0.03 Torr. In addition, before forming an oxide layer having a thickness of about 10 Å on the substrate 10, the reaction chamber 100 having the first pressure P1 of about 0.03 to about 3.0 Torr is effective. On the other hand, when the reaction chamber 100 has a pressure of above about 3.0 Torr before oxidizing the substrate 10, a native oxide layer may be formed on the substrate 10. If the native oxide layer is previously formed on the substrate 10, a desired oxide layer having the thickness of about 10 Å may not be formed on the substrate 10. For example, since a native oxide layer of about 20 Å may be formed on the substrate 10 under atmospheric pressure, a very thin oxide layer of about 10 Å may not be formed on the substrate 10 when the native oxide layer is formed on the substrate 10.

In the present invention, the pressure of the reaction chamber 100 is adjusted using the pressure control member 150.

When the first temperature $T_1$ of the reaction chamber 100 is below about 300° C., the oxide layer formed on the substrate 10 may be disadvantageously thick because the time for increasing the temperature of the reaction chamber 100 from the first temperature $T_1$ to a second temperature $T_2$ is exceedingly increased. On the other hand, when the first temperature $T_1$ of the reaction chamber 100 is above about 550° C., the native oxide layer may be formed on the substrate 10 before forming the desired oxide layer on the substrate 10. In this embodiment, the second temperature $T_2$ of the reaction chamber 100 is advantageously selected so as to form a desired thin oxide layer on the substrate 10.

In step I-2 (step S120), a reaction gas is provided onto the substrate 10 while the temperature of the reaction chamber 100 is increased. As a result, the substrate 10 is primarily oxidized to form a thin oxide layer having a thickness of below about 10 Å on the substrate 10. Particularly, after the pressure of the reaction chamber 100 is increased to about 0.3 to about 20 Torr, the reaction gas is introduced into the reaction chamber 100 to primarily oxidize the substrate 10 while the temperature of the reaction chamber 100 is increased. Alternatively, after the reaction gas may be provided onto the substrate 10 just before the pressure of the reaction chamber 100 is increased to about 0.3 to about 20 Torr, the substrate 10 is primarily oxidized to form the thin oxide layer on the substrate 10.

The temperature of the reaction chamber 100 is increased using an energy supply member 120 such as a heater. Here, the temperature of the reaction chamber 100 is increased from the first temperature $T_1$ to the second temperature $T_2$. The difference between the first temperature $T_1$ and the second temperature $T_2$ may be advantageously adjusted so as to control the thickness of the thin oxide layer formed on the substrate 10. In one embodiment, the second temperature $T_2$ of the reaction chamber 100 is in a range of about 550 to about 950° C.

When the second temperature $T_2$ of the reaction chamber 100 is below about 550° C., the difference between the first temperature $T_1$ and the second temperature $T_2$ is relatively small so that the oxide layer may have an insufficient thickness. Additionally, the reaction gas may be excessively provided onto the substrate 10 to form the oxide layer having a desired thickness. On the other hand, when the second temperature $T_2$ of the reaction chamber 100 is above about 950° C., the difference between the first temperature $T_1$ and the second temperature $T_2$ is too large so that the oxide layer may be disadvantageously thick. In addition, the characteristics of the oxide layer may be deteriorated because of a thermal effect due to a high temperature.

However, in the case in which an oxide layer having a relatively thick thickness of above about 10 Å is required, the second temperature $T_2$ of the reaction chamber 100 may exceed about 950° C.

The temperature of the reaction chamber 100 can be increased at a rate of about 2 to about 15° C./minute. When the rate of increase in the temperature of the reaction chamber 100 is below about 2° C./minute, the time for increasing the temperature of the reaction chamber 100 may be greatly extended to thereby reduce the throughput of the process for forming the oxide layer. On the other hand, when the rate of increase in the temperature of the reaction chamber 100 is above about 15° C./minute, the uniformity of the oxide layer may be deteriorated because of the rapid increase in the temperature although the temperature of the reaction chamber 100 may be rapidly increased to the second temperature $T_2$. In addition, the thickness of the oxide layer may not be precisely controlled due to the rapid increase in the temperature.

In one embodiment, the second pressure P2 of the reaction chamber 100 is in a range of about 0.3 to about 20 Torr while the temperature of the reaction chamber 100 is increased from the first temperature $T_1$ to the second temperature $T_2$. When the second pressure P2 of the reaction chamber 100 is below about 0.3 Torr, the oxide layer may not be sufficiently grown on the substrate 10. However, when the second pressure P2 of the reaction chamber 100 is above about 20 Torr, the oxide layer may have an undesired thick thickness while the temperature of the reaction chamber 100 is increased from the first temperature $T_1$ to the second temperature $T_2$. In addition, the uniformity of the oxide layer may be deteriorated relative to an entire surface of the substrate 10. As a result, the thickness difference among portions of the oxide layer positioned on the substrate 10 may be increased.

While the temperature of the reaction chamber 100 is increased from the first temperature $T_1$ to the second temperature $T_2$, the reaction gas for oxidizing the substrate 10 is provided into the reaction chamber 100 through a gas supply line 140. The reaction gas may be varied in accordance with the kind of oxide layer formed on the substrate 10. For example, when an oxide layer has a high breakdown voltage, a reaction gas including an oxygen gas ($O_2$) and a hydrogen gas ($H_2$) is provided onto the substrate 10 to form the oxide layer of the high breakdown voltage by a wet oxidation process. Here, the volume ratio between the oxygen gas and the hydrogen gas is about 2:3. For example, the reaction gas includes oxygen gas of about 0.62 liter and hydrogen gas of about 0.9 liter when the first temperature $T_1$ is about 550° C., the second temperature $T_2$ is about 950° C., and the rate of increase in the temperature is about 7° C./minute.

When an amount of the reaction gas is increased, the oxide layer may be more rapidly grown on the substrate 10. Thus, the amount of the reaction gas is advantageously adjusted considering the first temperature $T_1$, the second temperature $T_2$, the rate of increase in the temperature, the desired thickness of the oxide layer, etc.

In one embodiment of the present invention, a reaction gas including an oxygen gas is provided onto the substrate 10 by a dry oxidation process to form a buffer oxide layer on the substrate 10. In another embodiment of the present invention, a reaction gas including an oxygen gas and a hydrogen chloride (HCl) gas is provided onto the substrate 10 by a clean oxidation process to form another oxide layer on the substrate 10. Although the oxide layer may not have excellent characteristics using the dry oxidation process or the clean oxidation process, the oxide layer may be rapidly grown on the substrate 10 so that the oxide layer has the desired thickness for a very short time. Additionally, in the clean oxidation process, impurities may be completely removed from the oxide layer and the substrate 10 during the formation of the oxide layer.

In one embodiment of the present invention, an oxide layer may be formed on the substrate 10 using a combination process of a wet oxidation process, a dry oxidation process and a clean oxidation process. For example, the wet oxidation process is carried out at a temperature of about 800 to about 900° C. whereas the dry and clean oxidation processes are performed at a temperature of about 850 to about 1,000° C. Hence, after the oxide layer may be formed on the substrate 10 at relatively low temperature using the wet oxidation process, the oxide layer is completely formed on the substrate 10 at a relatively high temperature using the dry oxidation process or the clean oxidation process.

Referring now to FIGS. 1A and 1B, after the substrate 10 is primarily oxidized in step I-2 (step S120), the primarily oxidized substrate 10 may be additionally cooled in the reaction chamber 100 while the temperature of the reaction chamber 100 is decreased from the second temperature $T_2$ to a third temperature $T_3$ under a third pressure P3 in step I-4 (step S140). Here, the temperature of the reaction chamber 100 is reduced using a cooling member 160. Additionally, the cooled substrate 10 may be unloaded from the reaction chamber 100 under the third pressure P3 in step I-5 (step S150). In steps I-4 and I-5, the third pressure P3 is higher than the second pressure P2. For example, the third pressure P3 can correspond to atmospheric pressure. Here, the third temperature $T_3$ is substantially identical to the first temperature $T_1$. Alternatively, the third temperature $T_3$ may be higher than the first temperature $T_1$ because the substrate 10 may be unloaded from the reaction chamber 100 although the temperature of the reaction chamber 100 is relatively high.

In step I-4, the temperature of the reaction chamber 100 is reduced at a rate of about 2 to about 15° C./minute. When the rate of decrease in the temperature of the reaction chamber 100 is below about 2° C./minute, the time for cooling the substrate 10 may be exceedingly increased to thereby reduce the throughput of the process for forming the oxide layer. On the other hand, when the rate of decrease in the temperature of the reaction chamber 100 is above about 15° C./minute, the characteristics of the oxide layer may be greatly deteriorated.

In one embodiment of the present invention, when the second temperature $T_2$ is relatively low, the substrate 10 may be unloaded from the reaction chamber 100 after the reaction chamber 100 has the second temperature $T_2$. Here, the second temperature $T_2$ can be in a range of about 550 to about 750° C.

Alternatively, after the substrate 10 is primarily oxidized while the temperature of the reaction chamber 100 is increased in step I-2 (step S120), the substrate 10 may be secondarily oxidized in the reaction chamber 100 having the second pressure P2 and the second temperature $T_2$ in step I-3 (step S130). The thickness of the oxide layer formed on the primarily oxidized substrate 10 may be varied in accordance with the first temperature $T_1$, the second temperature $T_2$, the first pressure P1, the second pressure P2 the rate of increase in the temperature, the amount of the reaction gas, etc. When the oxide layer may not have the desired thickness through the primary oxidation process, the substrate 10 may be secondarily oxidized to thereby form the oxide layer having the desired thickness on the substrate 10 through the secondary oxidation process. For example, when the oxide layer is formed on the substrate 10 under processing conditions that include the first temperature $T_1$ of about 550° C., the second temperature $T_2$ of about 650° C., the rate of increase in the temperature of about 7° C./minute, the first pressure P1 of about 0.3 Torr, the second pressure P2 of about 3.0 Torr, the reaction gas including the oxygen gas of about 0.62 liter and the hydrogen gas of about 0.9 liter, the oxide layer has an insufficient thickness of about 3 to about 4 Å in accordance with the primary oxidation process. Thus, the oxide layer having the insufficient thickness is grown on the substrate 10 by the secondary oxidation process, thereby forming the oxide layer having the desired thickness of about 10 Å on the substrate 10.

In one embodiment of the present invention, after the substrate 10 is secondarily oxidized, the temperature of the reaction chamber 100 is reduced from the second temperature $T_2$ to the third temperature $T_3$ under the third pressure P3 to thereby cool the substrate 10 in step I-4. The cooled substrate 10 is unloaded from the reaction chamber 100 in step I-5. When the second temperature $T_2$ is relatively low, the substrate 10 may be unloaded from the reaction chamber 100 while the reaction chamber 100 has the second temperature $T_2$ without cooling the substrate 10 (that is, step I-4).

In addition, the primarily oxidized substrate 10 or the secondarily oxidized substrate 10 may be nitrified in the reaction chamber 100 having the second temperature $T_2$ and the second pressure so that an oxynitride layer is formed on the primarily oxidized substrate 10 or the secondarily oxidized substrate 10. This oxynitride layer may serve as a dielectric layer of a semiconductor device.

Figure 2A:
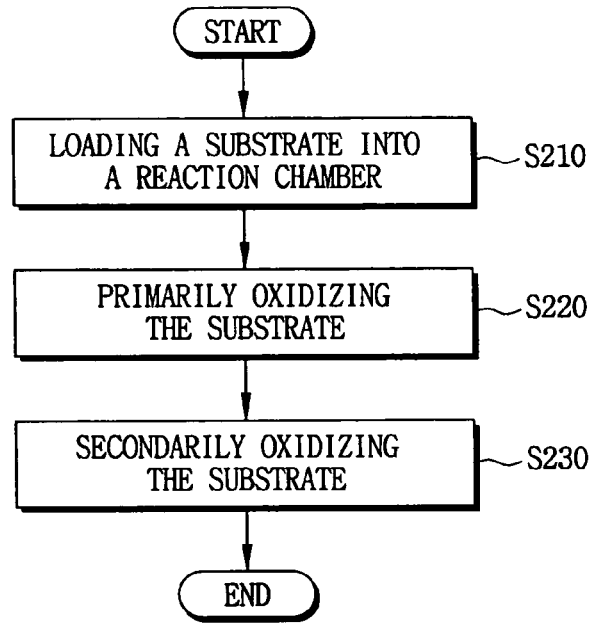
FIG. 2A is a flow chart illustrating a method of forming an oxide layer on a substrate in accordance with another embodiment of the present invention.
Figure 2B:
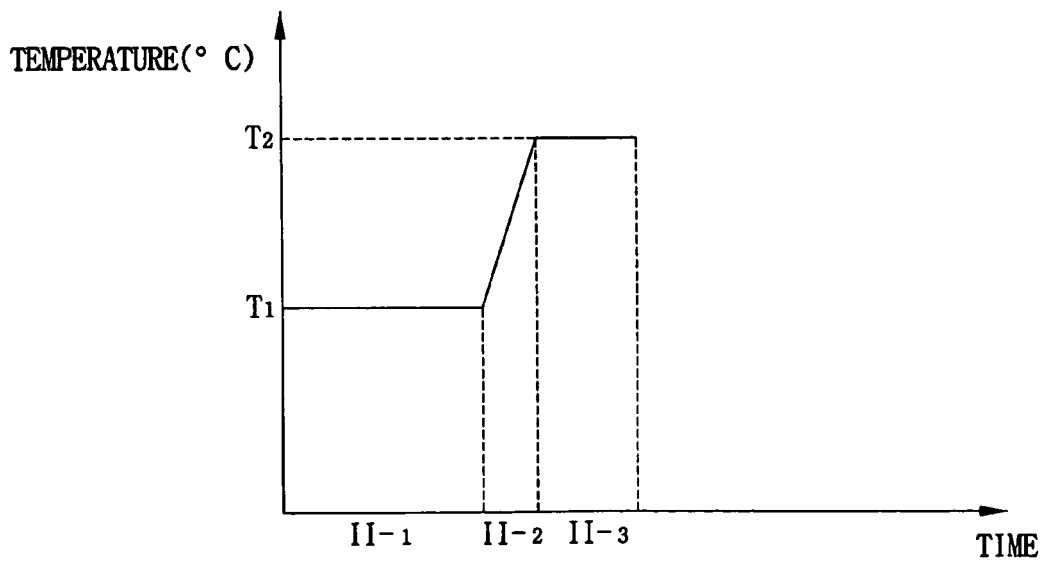
FIG. 2B is a timing diagram illustrating the method of forming the oxide layer on the substrate in accordance with another embodiment of the present invention.

FIG. 2A is a flow chart illustrating a method of forming an oxide layer on a substrate in accordance with another embodiment of the present invention, and FIG. 2B is a timing diagram illustrating the method of forming the oxide layer on the substrate in accordance with FIG. 2A.

Referring to FIGS. 2A and 2B, after a substrate is loaded into a reaction chamber having a first temperature $T_1$ in step S210, the substrate is primarily oxidized while the temperature of the reaction chamber is increased from the first temperature $T_1$ to a second temperature $T_2$ under a pressure of about 0.3 to about 20 Torr in step S220. In particular, the substrate is loaded into the reaction chamber having the first temperature $T_1$ of about 300 to about 550° C. in step II-1 (step S210). Here, the reaction chamber has a pressure of about 0.03 to about 3.0 Torr. While the reaction chamber has a pressure of about 0.3 to about 20 Torr, the temperature of the reaction chamber is increased from the first temperature $T_1$ to the second temperature $T_2$ at a rate of about 2 to about 15° C./minute. The substrate is primarily oxidized in the reaction chamber while increasing the temperature of the reaction chamber from the first temperature $T_1$ to the second temperature $T_2$ in step II-2 (step S220). The second temperature $T_2$ can be in a range of about 550 to about 950° C. However, the second temperature $T_2$ may be varied in accordance with a thickness of an oxide layer formed on the substrate. In the primary oxidation process, the pressure of the reaction chamber is maintained in a range of about 0.3 to about 20 Torr.

In one embodiment, the primarily oxidized substrate may be secondarily oxidized in the reaction chamber having the second temperature $T_2$ and the pressure of about 0.3 to about 20 Torr in step II-3 (step S230).

After the substrate is primarily oxidized or secondarily oxidized in the reaction chamber, the substrate may be cooled in the reaction chamber and unloaded from the reaction chamber as described above. Alternatively, the oxidized substrate may be directly unloaded from the reaction chamber.

Figure 3A:
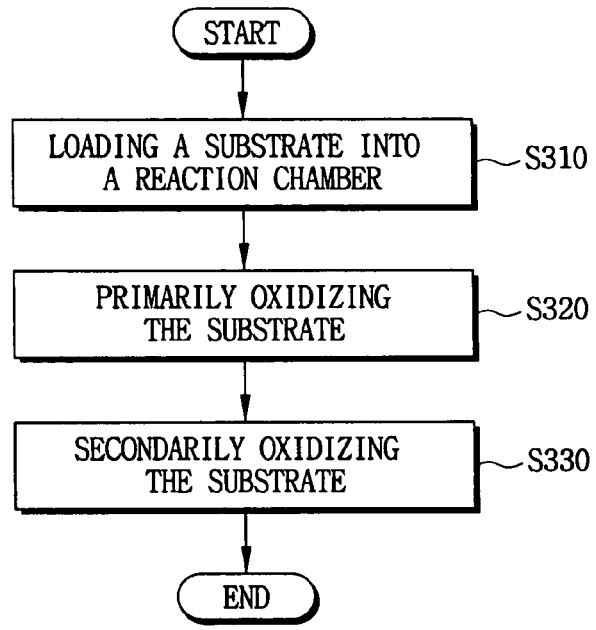
FIG. 3A is a flow chart illustrating a method of forming an oxide layer on a substrate in accordance with still another embodiment of the present invention.
Figure 3B:
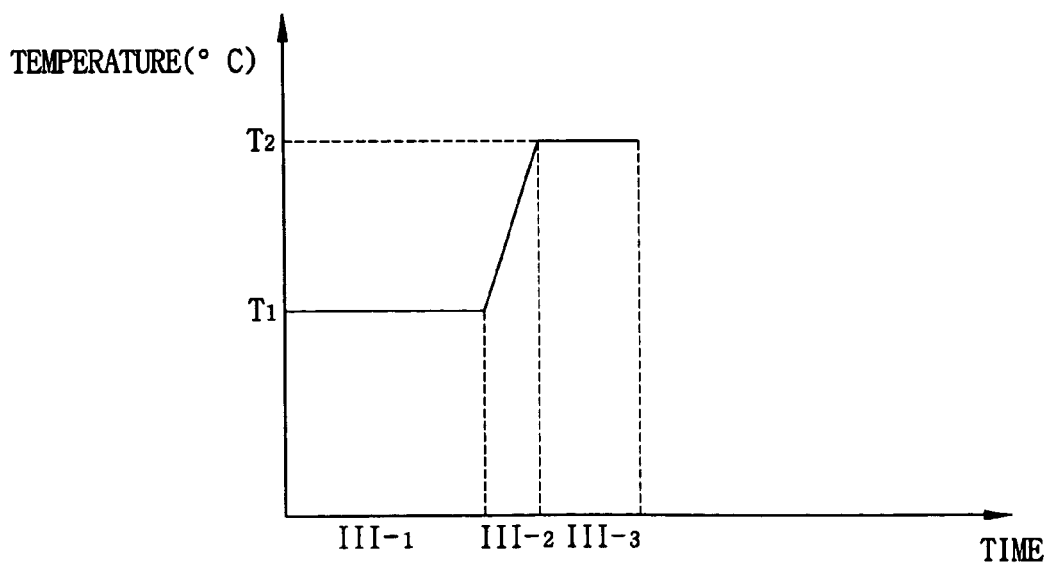
FIG. 3B is a timing diagram illustrating the method of forming the oxide layer on the substrate in accordance with still another embodiment of the present invention.

FIG. 3A is a flow chart illustrating a method of forming an oxide layer on a substrate in accordance with still another embodiment of the present invention, and FIG. 3B is a timing diagram illustrating the method of forming the oxide layer on the substrate in accordance with FIG. 3A.

Referring to FIGS. 3A and 3B, a substrate is loaded into a reaction chamber having a first pressure and a first temperature $T_1$ in step S310. The substrate is primarily oxidized in the reaction chamber by a wet oxidation process while the temperature of the reaction chamber is increased from the first temperature $T_1$ to a second temperature $T_2$ under a second pressure in step 320.

In particular, the substrate is loaded into the reaction chamber after the reaction chamber has the first pressure and the first temperature $T_1$ in step III-1 (step S310). For example, the reaction chamber may be employed in the batch type apparatus shown in FIG. 1. The first pressure of the reaction chamber can be in a range of about 0.03 to about 3.0 Torr, and the first temperature $T_1$ of the reaction chamber can be in a range of about 300 to about 550° C.

In step III-2 (step S320), the substrate is primarily oxidized in the reaction chamber by the wet oxidation process while the temperature of the reaction chamber is increased from the first temperature $T_1$ to the second temperature $T_2$ under the second pressure. The temperature of the reaction chamber is increased at a rate of about 2 to about 15° C./minute. In one embodiment, the second pressure is in a range of about 0.3 to about 20 Torr, and the second temperature $T_2$ is in a range of about 550 to about 950° C. However, the second pressure and the second temperature $T_2$ may be varied in accordance with the thickness of an oxide layer formed on the substrate.

In addition, the primarily oxidized substrate may be secondarily oxidized in the reaction chamber to obtain the oxide layer having a desired thickness after the reaction chamber has the second temperature $T_2$ under the second pressure of about 0.3 to about 20 Torr in step III-3 (step S330).

Furthermore, as described above, the primarily or secondarily oxidized substrate may be cooled in the reaction chamber and/or unloaded from the reaction chamber.

Figure 4A:
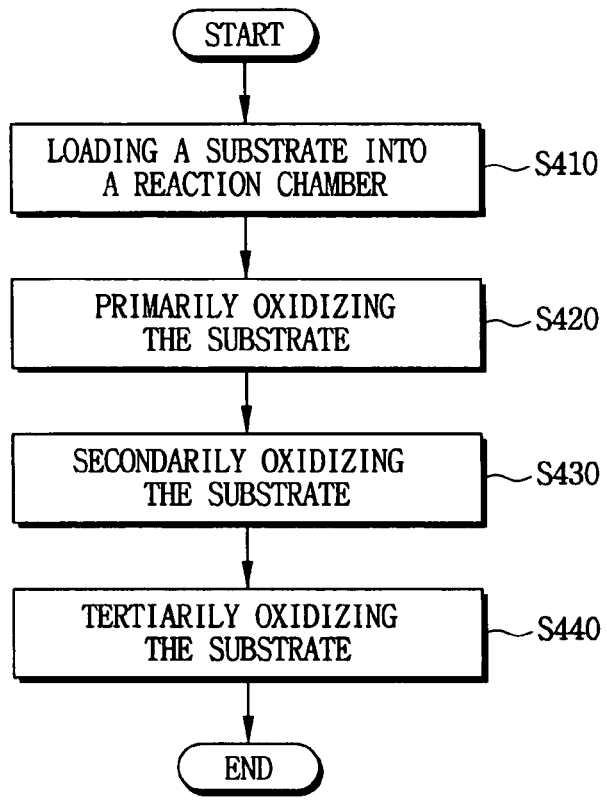
FIG. 4A is a flow chart illustrating a method of forming an oxide layer on a substrate in accordance with still another embodiment of the present invention.
Figure 4B:
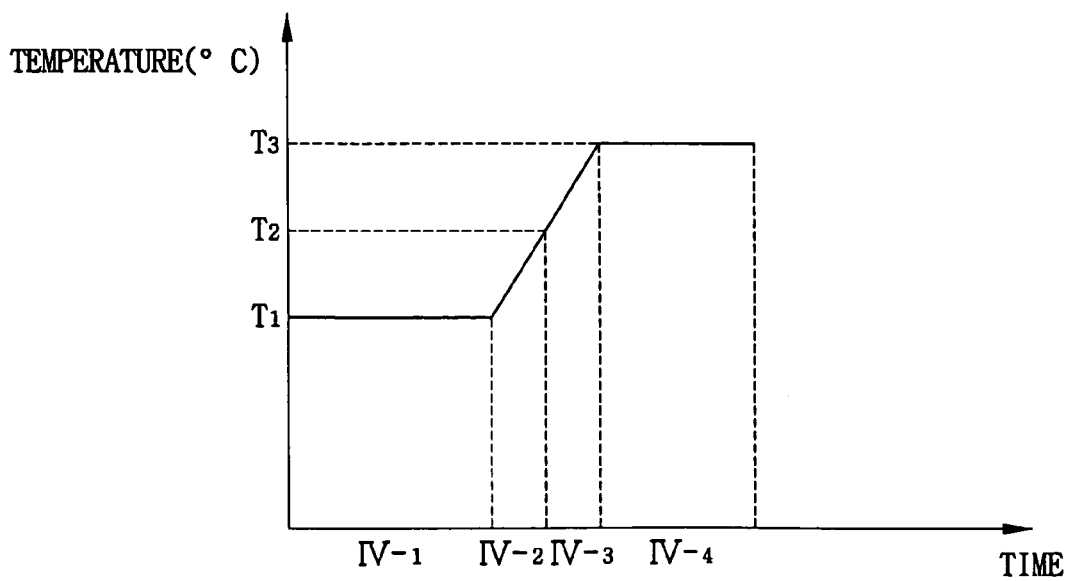
FIG. 4B is a timing diagram illustrating the method of forming the oxide layer on the substrate in accordance with still another embodiment of the present invention.

FIG. 4A is a flow chart illustrating a method of forming an oxide layer on a substrate in accordance with still another embodiment of the present invention, and FIG. 4B is a timing diagram illustrating the method of forming the oxide layer on the substrate in accordance with FIG. 4A.

Referring to FIGS. 4A and 4B, a substrate is loaded into a reaction chamber having a first pressure and a first temperature $T_1$ in step S410. The substrate is primarily oxidized in the reaction chamber by a wet oxidation process while the temperature of the reaction chamber is increased from the first temperature $T_1$ to a second temperature $T_2$ under a second pressure in step 420. The primarily oxidized substrate is secondarily oxidized in the reaction chamber by a dry oxidation process or a clean oxidation process while the temperature of the reaction chamber is increased from the second temperature $T_2$ to a third temperature $T_3$ under the second pressure in step S430. The secondarily oxidized substrate is tertiarily oxidized in the reaction chamber when the reaction chamber is at the third temperature $T_3$ and the second pressure in step S440.

Particularly, the substrate is loaded into the reaction chamber when the reaction chamber has the first pressure and the first temperature $T_1$ in step IV-1 (S410). For example, the reaction chamber may be employed in the batch type apparatus shown in FIG. 1. In one embodiment, the first pressure of the reaction chamber is in a range of about 0.03 to about 3.0 Torr, and the first temperature $T_1$ of the reaction chamber is in a range of about 300 to about 550° C.

In step IV-2 (step S420), the substrate is primarily oxidized in the reaction chamber using a reaction gas including an oxygen gas and a hydrogen gas by the wet oxidation process while the temperature of the reaction chamber is increased from the first temperature $T_1$ to the second temperature $T_2$ under the second pressure. Here, the temperature of the reaction chamber is increased at a rate of about 2 to about 15° C./minute. In one embodiment, the second pressure is in a range of about 0.3 to about 20 Torr, and the second temperature $T_2$ is in a range of about 550 to about 900° C.

The primarily oxidized substrate is secondarily oxidized in the reaction chamber by a dry oxidation process pr a clean oxidation process while the temperature of the reaction chamber is increased from the second temperature $T_2$ to the third temperature $T_3$ under the second pressure in step IV-3 (step S430). In the dry oxidation process, a reaction gas including an oxygen gas in provided onto the primarily oxidized substrate so as to secondarily oxidize the substrate. In the clean oxidation process, a reaction gas including an oxygen gas and a hydrogen chloride gas is provided onto the primarily oxidized substrate so as to secondarily oxidize the substrate. Here, the third temperature $T_3$ can be in a range of about 550 to about 950° C.

In step IV-4 (step S440), the secondarily oxidized substrate may be tertiarily oxidized to obtain the oxide layer having a desired thickness after the reaction chamber has the third temperature $T_3$ under the second pressure of about 0.3 to about 20 Torr.

Furthermore, as described above, the secondarily or tertiarily oxidized substrate may be cooled in the reaction chamber and/or unloaded from the reaction chamber.

In the present embodiment, the throughput of the process for forming the oxide layer of about 10 Å may be greatly increased because the oxide layer is formed on the substrate using the reaction chamber of the batch type apparatus. In addition, the oxide layer is formed on the substrate while the temperature of the reaction chamber is increased under a relatively low pressure so that the uniform oxide layer may be obtained.

Figure 5A:
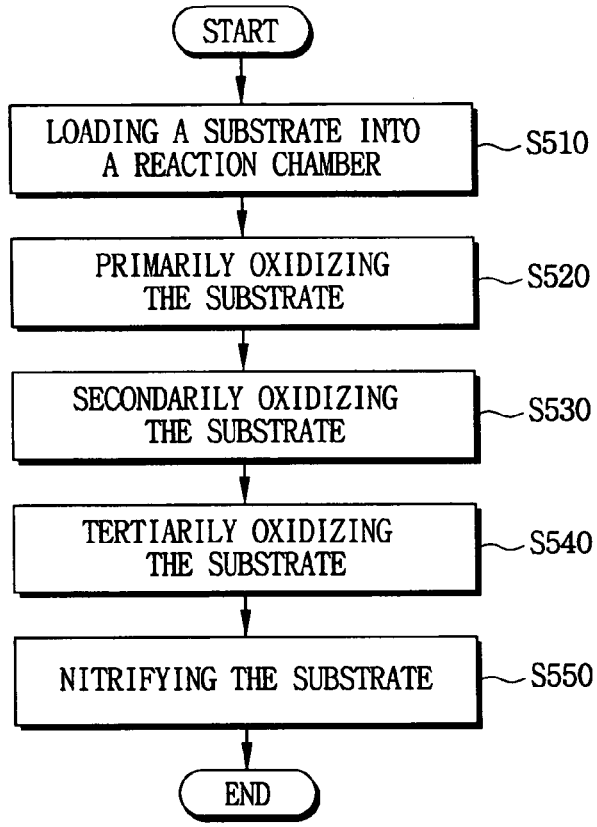
FIG. 5A is a flow chart illustrating a method of forming an oxynitride layer on a substrate in accordance with one embodiment of the present invention.

FIG. 5A is a flow chart illustrating a method of forming an oxynitride layer on a substrate in accordance with one embodiment of the present invention. In this embodiment, after an oxide layer is formed on a substrate, the oxide layer is nitrified to form the oxynitride layer on the substrate.

Referring to FIG. 5A, a substrate is loaded into a reaction chamber having a first pressure and a first temperature in step S510. The substrate is oxidized in the reaction chamber to form the oxide layer on the substrate while the temperature of the reaction chamber is increased from the first temperature to a third temperature via the second temperature under a second pressure in steps S520, S530 and S540. The oxidized substrate is nitrified in the reaction chamber after the reaction chamber has the second pressure and the third temperature in step S550.

Alternatively, the substrate may be primarily oxidized using a reaction gas in the reaction chamber while increasing the temperature of the reaction chamber from the first temperature to the second temperature under the second pressure in step S520. Then, the primarily oxidized substrate may be secondarily oxidized using a reaction gas in the reaction chamber while increasing the temperature of the reaction chamber from the second temperature to the third temperature under the second pressure in step the S530. In addition, the secondarily oxidized substrate may be tertiarily oxidized in the reaction chamber when the reaction chamber is at the third temperature under the second pressure in step S540.

Figure 5B:
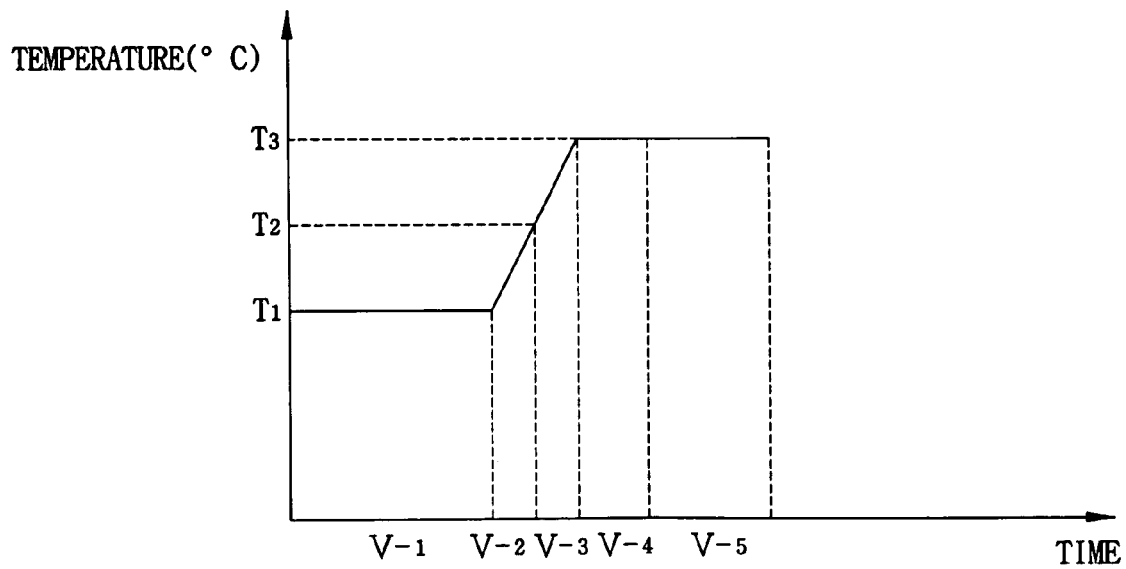
FIG. 5B is a timing diagram illustrating the method of forming the oxynitride layer on the substrate in accordance with another embodiment of the present invention.

FIG. 5B is a timing diagram illustrating the method of forming the oxynitride layer on the substrate in accordance with FIG. 5A.

Referring to FIGS. 5A and 5B, the substrate is loaded into the reaction chamber when the reaction chamber is at the first pressure and the first temperature $T_1$ in step V-1 (step S510).

Figure 5C:
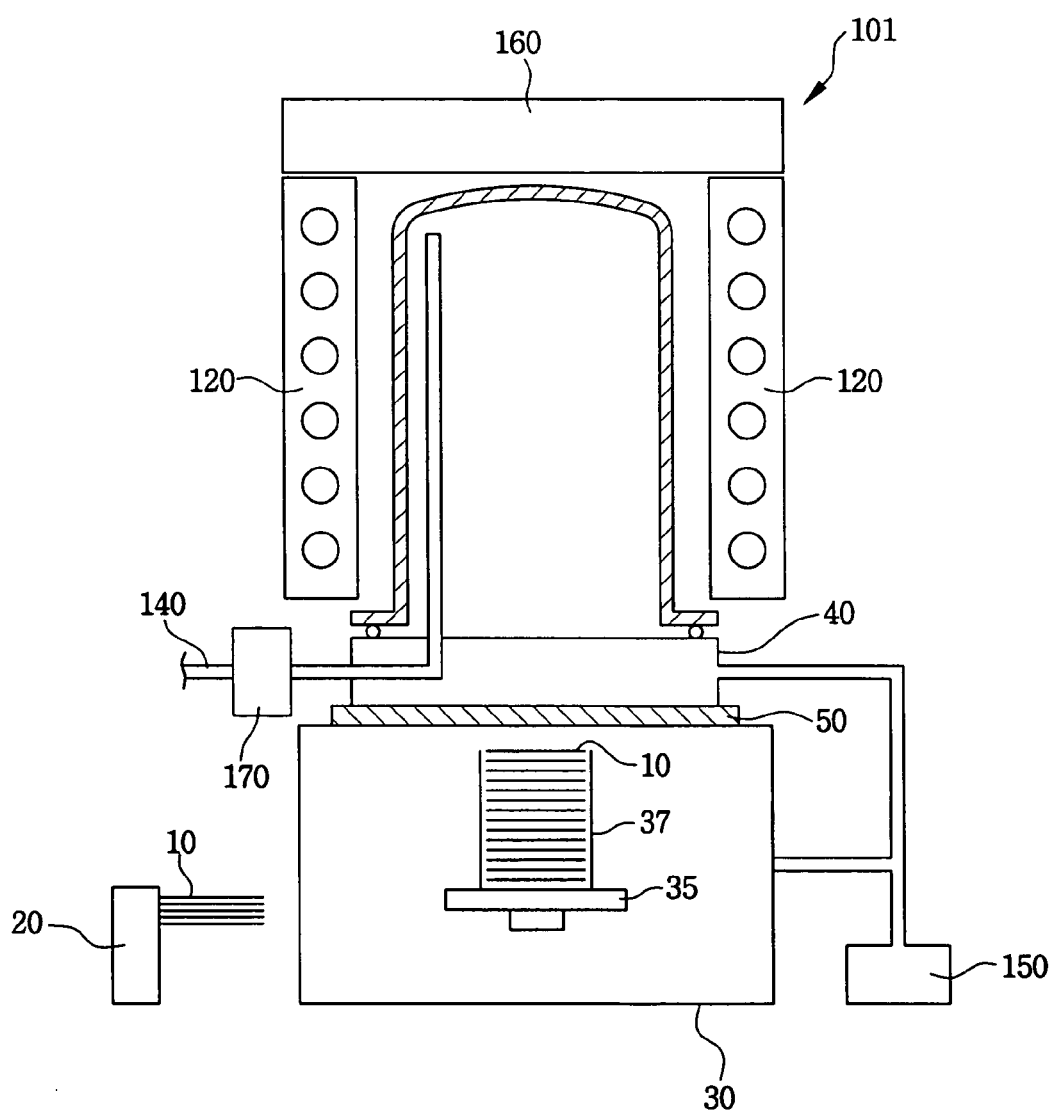
FIG. 5C is a cross-sectional view illustrating a reaction chamber for forming an oxynitride layer on a substrate in accordance with one embodiment of the present invention.

FIG. 5C is a cross-sectional view illustrating a reaction chamber for forming an oxynitride layer on a substrate in accordance with FIGS. 5A and 5B.

Referring to FIGS. 5B and 5C, the reaction chamber 101 includes a remote plasma generating device 170 for activating a source gas including nitrogen.

Before primarily oxidizing the substrate 10, the reaction chamber 101 is at the first pressure of about 0.03 to about 3.0 Torr and the first temperature $T_1$ of about 300 to about 550° C. It is difficult to reduce the pressure of the reaction chamber 101 to below about 0.03 Torr. Additionally, the reaction chamber 101 having the first pressure of about 0.03 to about 3.0 Torr so as to oxidize the substrate 10 is economical. On the other hand, when the reaction chamber 101 has a pressure of above about 3.0 Torr before primarily oxidizing the substrate 10, a native oxide layer may be formed on the substrate 10. In the case in which the native oxide layer is previously formed on the substrate 10, a desired oxynitride layer having the thickness of about 10 Å may not be formed on the substrate 10.

When the first temperature $T_1$ of the reaction chamber 101 is below about 300° C., the oxide layer formed on the substrate 10 may be disadvantageously thick because the time for increasing the temperature of the reaction chamber 101 from the first temperature $T_1$ to the third temperature $T_3$ is exceedingly increased. On the contrary, when the first temperature $T_1$ of the reaction chamber 101 is above about 550° C., the native oxide layer may be formed on the substrate 10 before forming the oxide layer on the substrate 10.

In step V-2 (step S520), the substrate 10 is primarily oxidized in the reaction chamber 101 using a reaction gas while the temperature of the reaction chamber 101 is increased from the first temperature $T_1$ to the second temperature $T_2$ under the second pressure. Thus, a primary oxide film is formed on the substrate 10. In step V-3 (step S530), the primarily oxidized substrate 10 is secondarily oxidized in the reaction chamber while increasing the temperature of the reaction chamber 101 from the second temperature $T_2$ to the third temperature $T_3$ under the second pressure. As a result, a secondary oxide layer having a desired thickness of about 10 Å is formed on the substrate 10. However, when the primary oxide layer has the desired thickness about 10 Å, the substrate 10 may not be secondarily oxidized to form the secondary oxide layer. That is, an oxide layer having the desired thickness of about 10 Å may be directly formed on the substrate 10 while increasing the temperature of the reaction chamber 101 from the first temperature $T_1$ to the third temperature $T_3$ under the second pressure. Here, the third temperature $T_3$ can be in a range of about 550 to about 950° C. The thickness of the oxide layer formed on the substrate 10 may be adjusted by controlling the difference between the first temperature $T_1$ and the third temperature $T_3$. When the third temperature $T_3$ is below about 550° C., the amount of the reaction gas may be greatly increased so as to form the oxide layer having the desired thickness. On the other hand, when the third temperature $T_3$ is above about 950° C., the oxide layer may be too thick and may be thermally damaged due to a high temperature.

The rate in increase of the temperature of the reaction chamber 101 can be in a range of about 2 to about 15° C./minute. When the rate in increase of the temperature of the reaction chamber is below about 2° C./minute, the time for increasing the reaction chamber 101 may be too long so that the throughput of the process for forming the oxynitride layer may be reduced. When the rate in increase of the temperature of the reaction chamber is above about 15° C./minute, the uniformity of the oxide layer may be deteriorated because of a rapid temperature increase.

While the temperature of the reaction chamber 101 is increased from the first temperature $T_1$ to the third temperature $T_3$, the pressure of the reaction chamber 101 is maintained in the range of about 0.3 to about 20 Torr. When the reaction chamber 101 has a pressure of below about 0.3 Torr, the oxide layer may not be adequately grown on the substrate 10. However, when the reaction chamber 101 has a pressure of above about 20 Torr, the oxide layer may be too thick and portions of the oxide layer may have different thickness to thereby reduce the uniformity of the oxide layer.

In this embodiment, the reaction gas for forming the oxide layer is provided onto the substrate 10 while increasing the temperature of the reaction chamber 101 from the first temperature $T_1$ to the third temperature $T_3$. The ingredients of the reaction gas may vary in accordance with the characteristics of the oxide layer formed on the substrate 10. For example, when an oxide layer has a high breakdown voltage, the reaction gas including an oxygen gas and a hydrogen gas is provided onto the substrate 10 to form the oxide layer of the high breakdown voltage by a wet oxidation process. Here, the volume ratio between the oxygen gas and the hydrogen gas is about 2:3. When the amount of the reaction gas is increased, the oxide layer may be more rapidly grown on the substrate 10. The amount of the reaction gas is determined in accordance with the first temperature $T_1$, the third temperature $T_2$, the rate in increase of the temperature, the desired of thickness of the oxide layer, etc. Additionally, an oxide layer may be formed on the substrate 10 using a reaction gas including an oxygen gas by a dry oxidation process, or using a reaction gas including an oxygen gas and a hydrogen chloride gas by a clean oxidation process. When the oxide layer is formed by the dry oxidation process or the clean oxidation process, the oxide layer is rapidly formed on the substrate 10 although the quality of the oxide layer may be relatively reduced.

In one embodiment of the present invention, the oxide layer is formed on the substrate 10 by a combination process of the wet oxidation process, the dry oxidation process or the clean oxidation process. For example, the substrate 10 is primarily oxidized in the reaction chamber 101 by the wet oxidation process while increasing the temperature of the reaction chamber 101 from the first temperature $T_1$ to the second temperature $T_2$ under the second pressure in step V-2. Then, the primarily oxidized substrate 10 is secondarily oxidized by the dry oxidation process or the clean oxidation process while increasing the temperature of the reaction chamber 101 from the second temperature $T_2$ to the third temperature $T_3$ under the second pressure in step V-3. Here, the second temperature $T_2$ may be properly selected in a range between the first temperature $T_1$ and the third temperature $T_3$ in accordance with the characteristics of the oxide layer. For example, when the oxide layer having a uniform quality on the substrate 10, the second temperature $T_2$ may be relatively high so that the time of the wet oxidation process may be longer than that of the dry or the clean oxidation process.

In step V-5 (step S550), the primarily or secondarily oxidized substrate 10 is nitrified in the reaction chamber 101 having the second pressure and the third temperature $T_3$, thereby forming the oxynitride layer on the substrate 10. Alternatively, the oxynitride layer may be formed on the substrate 10 after the substrate 10 is tertiarily oxidized in the reaction chamber having the second pressure and the third temperature $T_3$.

The substrate 10 is nitrified in the reaction chamber 101 using a reaction gas including a nitrogen compound such as nitrogen ($N_2$), nitrogen monoxide (NO), dinitrogen monoxide ($N_2O$), etc. Here, the nitrogen compound is activated using the remote plasma generating device 170. When the nitrogen compound is activated using plasma in the reaction chamber 101, the substrate 10 including the oxide layer may be seriously damaged by the plasma. Thus, the remote plasma generating device 170 is separated from the reaction chamber 101 and the nitrogen compound is activated out of the reaction chamber 101, thereby preventing damage to the substrate 10.

In one embodiment, the oxynitride layer may serve as a diffusion preventing layer that prevents a leakage current generated from a gate electrode of a MOS transistor. Particularly, a recent semiconductor device has an oxide layer of below about 10 Å as a gate insulation layer. For example, in a PMOS transistor having this gate insulation layer, P-type impurities such as boron (B) implanted into a gate electrode of the PMOS transistor may be diffused into a silicon substrate through the gate insulation layer although a voltage is not applied to the gate electrode. The diffused impurities may cause the leakage current from the gate electrode, thereby causing a failure of the PMOS transistor. However, when the oxynitride layer of the present invention is employed as the gate insulation layer of the PMOS transistor, the diffusion of the impurities may be prevented to reduce the failure of the transistor.

In the present embodiment, the oxynitride layer is formed using one reaction chamber so that the throughput of the process for forming the oxynitride layer may be improved. In addition, the oxynitride layer is formed at a relatively low pressure using the nitrogen compound activated by the remote plasma generating device so that the oxynitride layer may have excellent quality without a thermal damage thereof.

After forming the oxynitride layer on the substrate 10, the substrate 10 may be cooled in the reaction chamber 101 and then unloaded from the reaction chamber 101. Alternatively, the substrate 10 may be unloaded from the reaction chamber 101 without cooling the substrate 10.

Figure 6A:
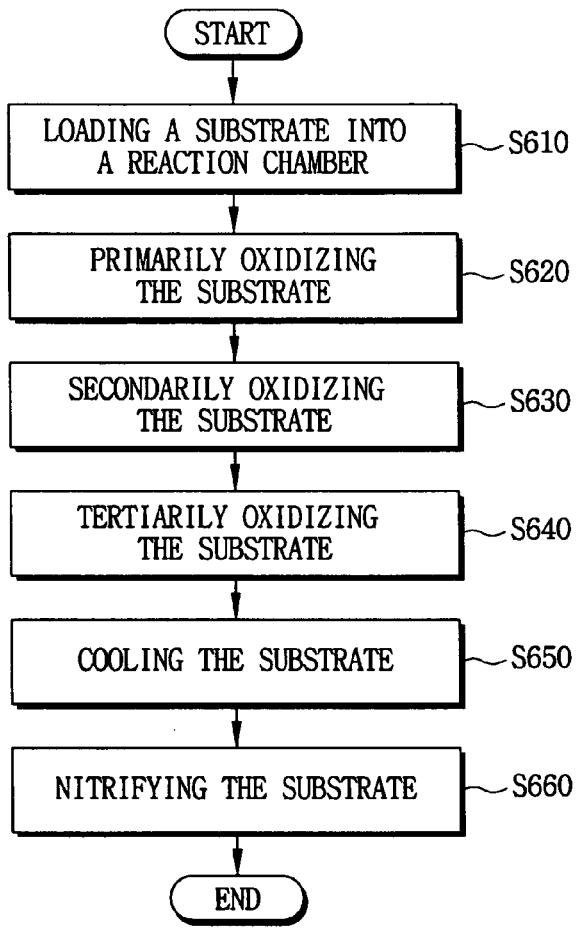
FIG. 6A is a flow chart illustrating a method of forming an oxynitride layer on a substrate in accordance with another embodiment of the present invention.
Figure 6B:
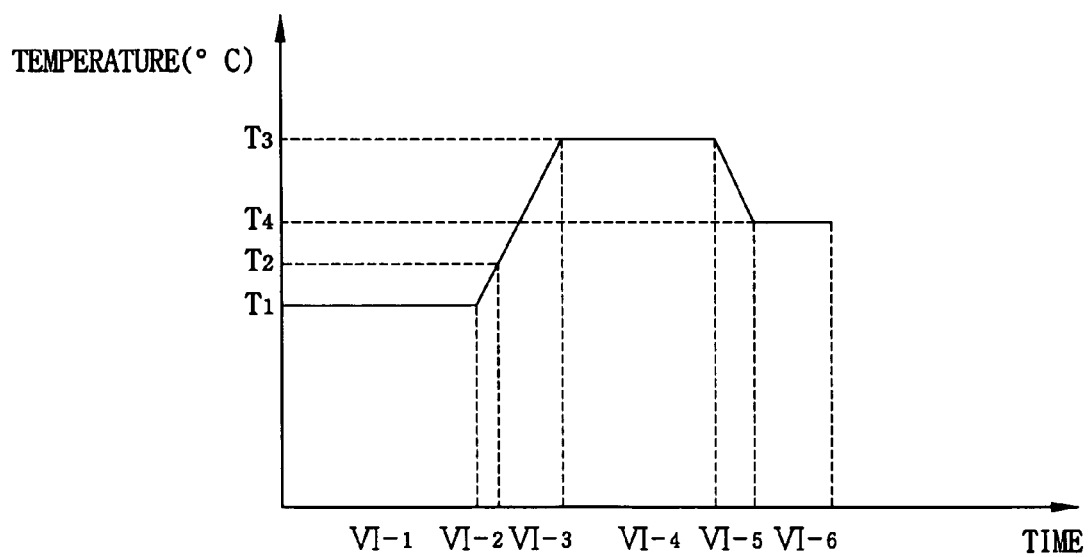
FIG. 6B is a timing diagram illustrating the method of forming the oxynitride layer on the substrate in accordance with another embodiment of the present invention.

FIG. 6A is a flow chart illustrating a method of forming an oxynitride layer on a substrate in accordance with another embodiment of the present invention, and FIG. 6B is a timing diagram illustrating the method of forming the oxynitride layer on the substrate in accordance with FIG. 6A.

Referring to FIGS. 6A and 6B, a substrate is loaded into a reaction chamber having a first temperature and a first pressure in step S610. The substrate is oxidized in the reaction chamber to form an oxide layer thereon while increasing the temperature of the reaction chamber from the first temperature to a third temperature under a second pressure in steps S620, S630 and S640.

In one embodiment, the substrate is primarily oxidized in the reaction chamber while the temperature of the reaction chamber is increased from the first temperature to a second temperature under the second pressure in step S620. The primarily oxidized substrate is secondarily oxidized in the reaction chamber while increasing the temperature of the reaction chamber from the second temperature to the third temperature under the second pressure in step S630. Then, the secondarily oxidized substrate is tertiarily oxidized in the reaction chamber after the reaction chamber has the third temperature and the second pressure in step S640.

The substrate is cooled in the reaction chamber while decreasing the temperature of the reaction chamber from the third temperature to a fourth temperature under the second pressure in step S650.

In step S660, the cooled substrate is nitrified in the reaction chamber after the reaction chamber has the fourth temperature and the second pressure.

As shown in FIG. 6B, in step VI-1 (step S610), the substrate is loaded into the reaction chamber when the reaction chamber is at the first temperature $T_1$ and the first pressure. Here, the reaction chamber may correspond to the reaction apparatus in FIG. 5C. In one embodiment, the first pressure is in a range of about 0.03 to about 3.0 Torr, and the first temperature $T_1$ is in a range of about 300 to about 550° C.

While the temperature of the reaction chamber is increased from the first temperature $T_1$ to the third temperature $T_3$ under the second pressure, the substrate is oxidized in the reaction chamber in steps VI-2, VI-3 and VI-4 (steps S620, S630 and S640). The temperature of the reaction chamber is changed at a rate of about 2 to about 15° C./minute. The second pressure is in a range of about 0.3 to about 20 Torr, and the third temperature $T_3$ is about 550 to about 900° C.

The substrate is oxidized by a wet oxidation process, a dry oxidation process, a clean oxidation process, or a combination process of the wet, the dry or the clean oxidation processes. For example, while increasing the temperature of the reaction chamber from the first temperature $T_1$ to the second temperature $T_2$ under the second pressure, a reaction gas including an oxygen gas and a hydrogen gas is provided onto the substrate so as to primarily oxidize the substrate in step VI-2 (step S620). Then, the primarily oxidized substrate is secondarily oxidized in the reaction chamber while increasing the temperature of the reaction chamber from the second temperature $T_2$ to the third temperature $T_3$ under the second pressure in step VI-3 (step S630).

The substrate may be tertiarily oxidized in the reaction chamber when the reaction chamber is at the third temperature $T_3$ under the second pressure in step VI-4 (step S640).

In step VI-5 (step S650), the secondarily or tertiarily oxidized substrate may be cooled in the reaction chamber while decreasing the temperature of the reaction chamber from the third temperature $T_3$ to the fourth temperature $T_4$ under the second pressure. Here, the temperature of the reaction chamber is reduced at a rate of about 2 to about 15° C./minute. The fourth temperature $T_4$ can be between the first temperature $T_1$ and the third temperature $T_3$.

The cooled substrate is nitrified in the reaction chamber having the fourth temperature $T_4$ and the second pressure to form an oxynitride layer on the substrate in step VI-6 (step S660).

The substrate having the oxynitride layer thereon is unloaded from the reaction chamber as described above.

Figure 7A:
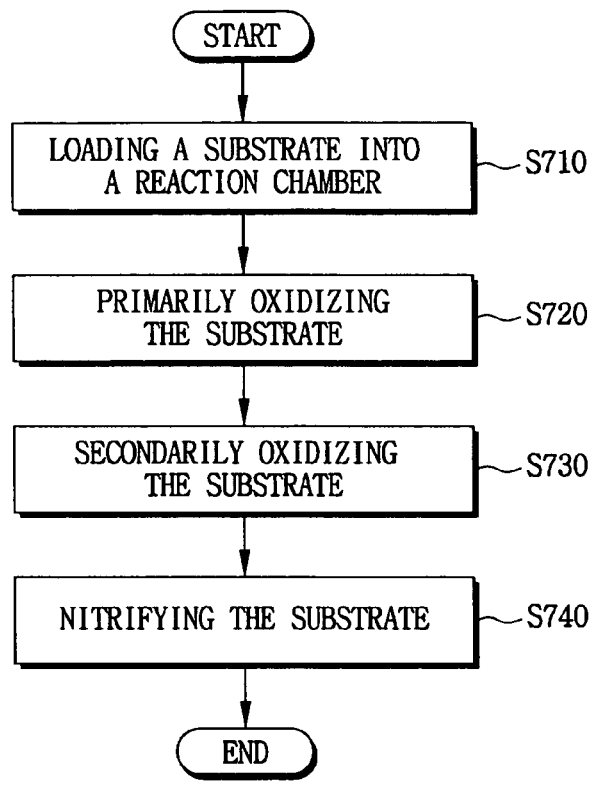
FIG. 7A is a flow chart illustrating a method of forming an oxynitride layer on a substrate in accordance with still another embodiment of the present invention.
Figure 7B:
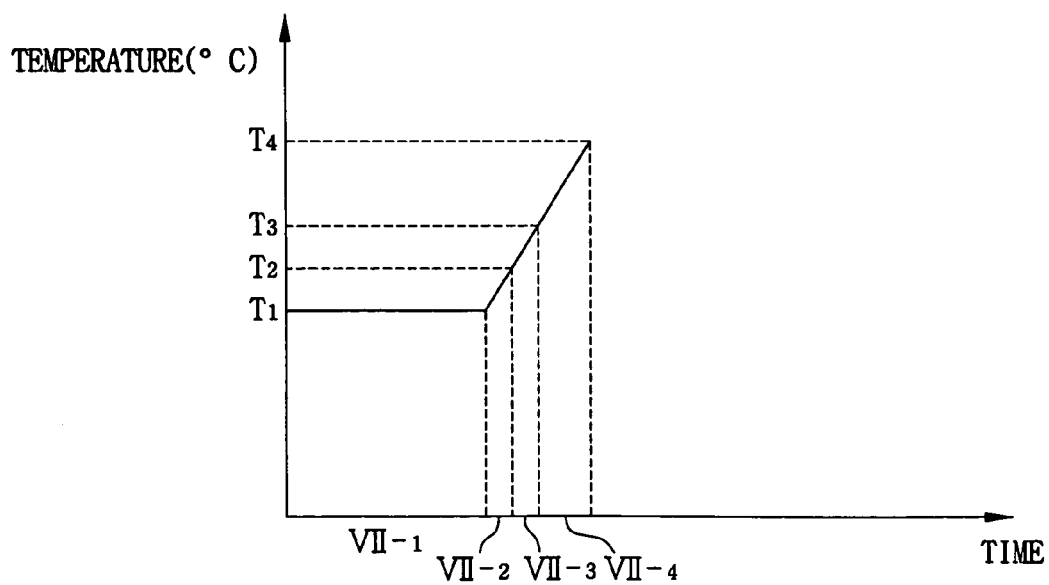
FIG. 7B is a timing diagram illustrating the method of forming the oxynitride layer on the substrate in accordance with still another embodiment of the present invention.

FIG. 7A is a flow chart illustrating a method of forming an oxynitride layer on a substrate in accordance with still another embodiment of the present invention, and FIG. 7B is a timing diagram illustrating the method of forming the oxynitride layer on the substrate in accordance with FIG. 7A.

Referring to FIGS. 7A and 7B, a substrate is loaded into a reaction chamber having a first temperature and a first pressure in step S710. The substrate is oxidized in the reaction chamber to form an oxide layer thereon while increasing the temperature of the reaction chamber from the first temperature to a third temperature under a second pressure in steps S720 and S730.

In one embodiment, the substrate is primarily oxidized in the reaction chamber while the temperature of the reaction chamber is increased from the first temperature to a second temperature under the second pressure in step S720. The primarily oxidized substrate is secondarily oxidized in the reaction chamber while increasing the temperature of the reaction chamber from the second temperature to the third temperature under the second pressure in step S730.

In step S740, the substrate is nitrified in the reaction chamber while increasing the temperature of the reaction chamber from the third temperature to a fourth temperature under the second pressure.

As shown in FIG. 7B, in step VII-1 (step S710), the substrate is loaded into the reaction chamber after the reaction chamber has the first temperature $T_1$ and the first pressure. Here, the reaction chamber may correspond to the reaction apparatus in FIG. 5C. In one embodiment, the first pressure is in a range of about 0.03 to about 3.0 Torr, and the first temperature $T_1$ is in a range of about 300 to about 550° C.

While the temperature of the reaction chamber is increased from the first temperature $T_1$ to the third temperature $T_3$ under the second pressure, the substrate is oxidized in the reaction chamber in steps VII-2 and VII-3 (steps S720 and S730). The temperature of the reaction chamber is changed at a rate of about 2 to about 15° C./minute. The second pressure is in a range of about 0.3 to about 20 Torr, and the third temperature $T_3$ is about 550 to about 900° C.

The substrate is oxidized by a wet oxidation process, a dry oxidation process, a clean oxidation process, or a combination process of the wet, the dry or the clean oxidation processes. For example, while increasing the temperature of the reaction chamber from the first temperature $T_1$ to the second temperature $T_2$ under the second pressure, a reaction gas including an oxygen gas and a hydrogen gas is provided onto the substrate to primarily oxidize the substrate in step VII-2 (step S720). Then, the primarily oxidized substrate is secondarily oxidized in the reaction chamber while increasing the temperature of the reaction chamber from the second temperature $T_2$ to the third temperature $T_3$ under the second pressure in step VII-3 (step S730).

The substrate is nitrified in the reaction chamber while the temperature of the reaction chamber is increased from the third temperature $T_3$ to the fourth temperature $T_4$ under the second pressure to form an oxynitride layer on the substrate in step VII-4 (step S740). The substrate having the oxynitride layer thereon is unloaded from the reaction chamber as described above.

In this embodiment, the substrate is oxidized and nitrified while increasing the temperature of the reaction chamber. The oxynitride layer is formed in a reaction chamber of the batch type apparatus so that the throughput of the process for forming the oxynitride layer may be greatly increased.

Additionally, the damage to the oxynitride layer may be prevented since the nitration process is carried out using the remote plasma generating device under a low pressure.

Figure 8A:
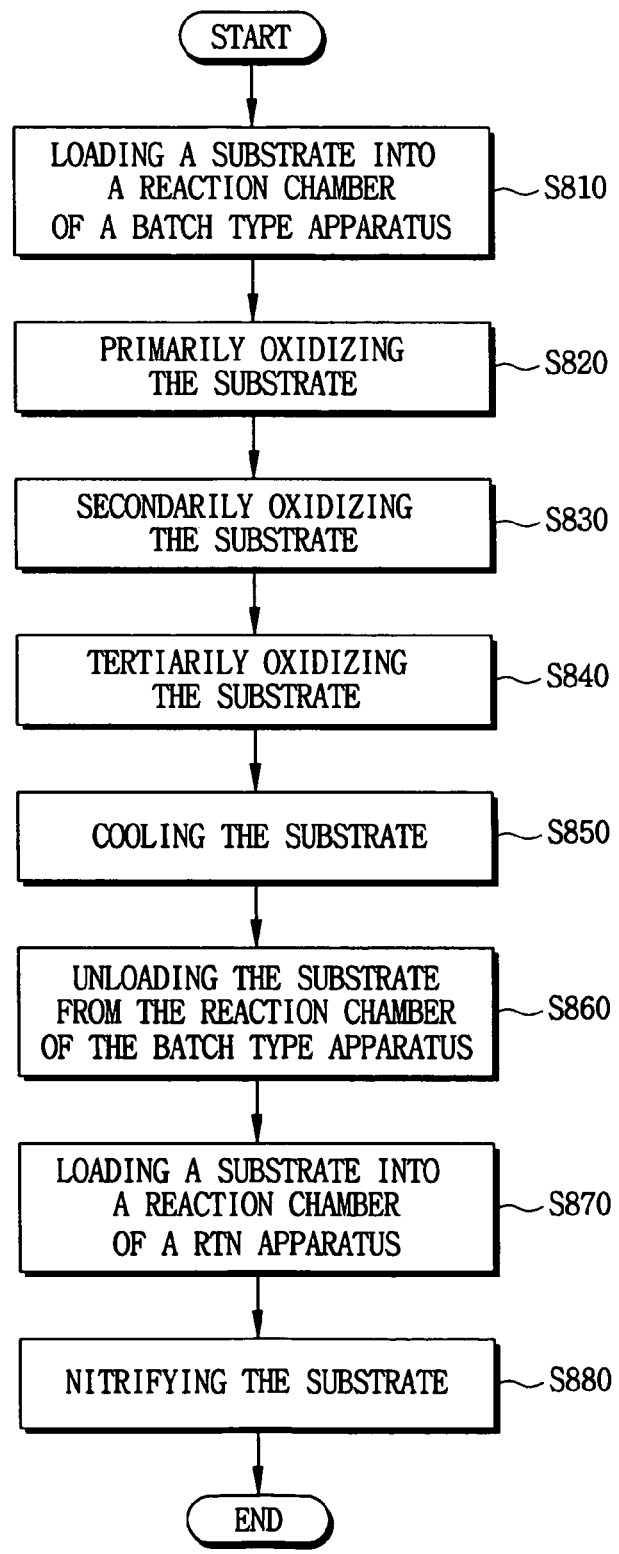
FIG. 8A is a flow chart illustrating a method of forming an oxynitride layer on a substrate in accordance with still another embodiment of the present invention.

FIG. 8A is a flow chart illustrating a method of forming an oxynitride layer on a substrate in accordance with still another embodiment of the present invention. In this embodiment, an oxide layer is formed on a substrate in a first reaction chamber of the batch type apparatus, whereas an oxynitride layer is formed on the substrate in a second reaction chamber of the single type apparatus.

Referring to FIG. 8A, the substrate is loaded into the first reaction chamber of the batch type apparatus after the reaction chamber has a first pressure and a first temperature in step S810. In steps S820 and S830, the substrate is oxidized in the first reaction chamber while increasing the temperature of the first reaction chamber from the first temperature to a third temperature under a second pressure. Alternatively, the substrate is primarily oxidized in the first reaction chamber while increasing the temperature of the first reaction chamber from the first temperature to a second temperature under a second pressure in step S820. Then, the primarily oxidized substrate is secondarily oxidized in the first reaction chamber while the temperature of the first reaction chamber is increased from the second temperature to the third temperature under a second pressure in step S830. In addition, the secondarily oxidized substrate may be tertiarily oxidized in the first reaction chamber when the first reaction chamber is at the third temperature under the second pressure in step S840.

The oxidized substrate is cooled in the first reaction chamber while decreasing the temperature of the first reaction chamber from the third temperature to a fourth temperature under a third pressure in step S850.

After the cooled substrate is unloaded from the first reaction chamber in step S860, the substrate is loaded into the second reaction chamber of the RTN apparatus in step S870. The oxidized substrate is nitrified in the second reaction chamber to form the oxynitride layer on the substrate in step S880. Here, the substrate is nitrified using a reaction gas including an ammonia ($NH_3$) gas. The RTN apparatus may include a lamp heating device, a laser heating device, an electron beam heating device, an ion beam heating device, etc.

Particularly, the substrate is loaded into the first reaction chamber after the first reaction chamber has the first pressure and the first temperature in step S810. The first pressure is about 0.03 to about 3.0 Torr, and the first temperature is about 300 to about 550° C.

While increasing the temperature of the first reaction chamber from the first temperature to the third temperature via the second temperature under the second pressure, a reaction gas is provided onto the substrate to thereby form an oxide layer of about 10 Å on the substrate in steps S820 and S830. The difference between the first temperature and the third temperature may be advantageously adjusted to properly control the thickness of the oxide layer. For example, the third temperature is about 550 to about 950° C., and the temperature of the first reaction chamber is increased from the first temperature to the third temperature at a rate of about 2 to about 15° C./minute. While increasing the temperature of the first reaction chamber, the second pressure of the first reaction chamber is maintained at about 0.3 to about 20 Torr. The reaction gas may vary in accordance with the characteristics of the oxide layer formed on the substrate. For example, to form an oxide layer having high quality, a reaction gas including an oxygen gas and a hydrogen gas is provided onto the substrate by a wet oxidation process. Alternatively, to form a buffer oxide layer, a reaction gas including an oxygen gas or an oxygen gas and a hydrogen chloride is provided onto the substrate by a dry oxidation process or a clean oxidation process.

However, the oxide layer may be formed on the substrate 10 by a combination process of the wet, the dry or the clean oxidation process. For example, the substrate is primarily oxidized using the reaction gas including the oxygen gas and the hydrogen gas while increasing the temperature of the first reaction chamber from the first temperature to the second temperature under the second pressure in step S820. Subsequently, the primarily oxidized substrate is secondarily oxidized while increasing the temperature of the first reaction chamber from the second temperature to the third temperature under the second pressure in step S830. Additionally, the secondarily oxidized substrate may be tertiarily oxidized in the first reaction chamber after the first reaction chamber has the third temperature in step S840.

The oxidized substrate is cooled in the first reaction chamber while decreasing the temperature of the reaction chamber from the third temperature to the fourth temperature under the third pressure in step S850. Here, the temperature of the reaction chamber is reduced at a rate of about 2 to about 15° C./minute. The third pressure is more than the second pressure, and the fourth temperature is between the first temperature and the third temperature.

In step S860, the substrate including the oxide layer thereon is unloaded from the first reaction chamber. The substrate is loaded into the second chamber using a transferring device in step S870. The substrate is nitrified in the second reaction chamber to form the oxynitride layer on the substrate in step S880.

Figure 8B:
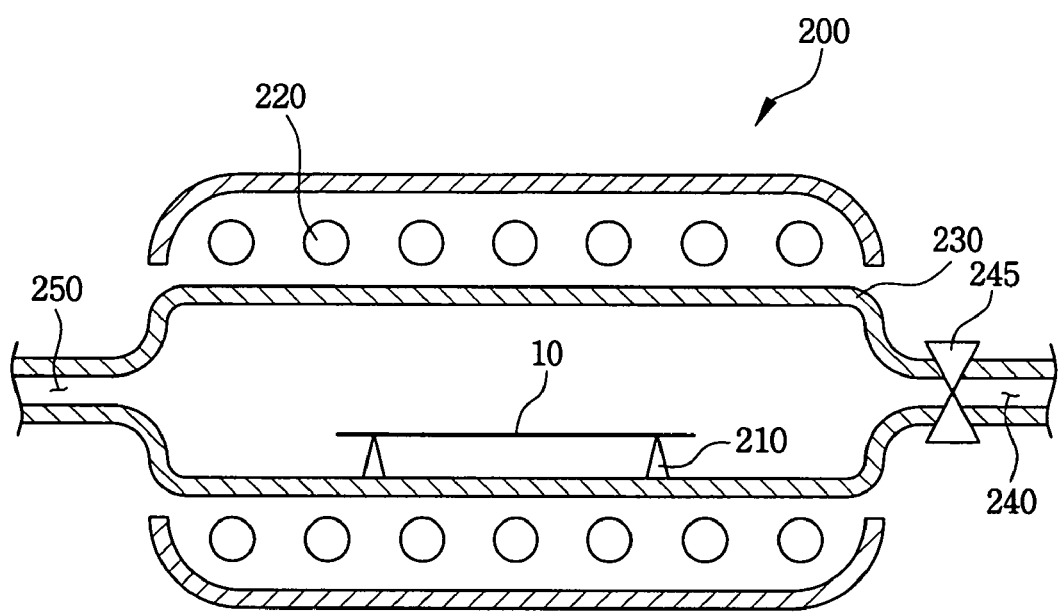
FIG. 8B is a schematic cross-sectional view illustrating a rapid thermal nitration apparatus of forming the oxynitride layer on the substrate in accordance with still another embodiment of the present invention.

FIG. 8B is a schematic cross-sectional view illustrating a rapid thermal nitration apparatus for forming the oxynitride layer on the substrate in accordance with the present invention.

Referring to FIG. 8B, the RTN apparatus 200 includes a substrate holder 210 for supporting a substrate 10, an energy supply member 220 for providing an energy to the substrate 10 to form an oxynitride layer thereon, a gas supply line 240 for providing a reaction gas onto the substrate 10, a mass flow controller 245 for controlling the flow rate of the reaction gas, and a gas discharging line 250 for exhausting the reaction gas after forming the oxynitride layer.

Although the RTN apparatus 200 is the single type apparatus and has a relatively low throughput relative to that of the batch type apparatus, the maintenance of the RTN apparatus 200 is relatively simple and the process of forming the oxynitride layer may be carried out under various conditions using the RTN apparatus 200. The RTN apparatus 200 may include the energy supply member 220 such as a halogen lamp, a laser beam generator, an electron beam generator, an ion beam generator, etc. When the energy supply member 220 is the halogen lamp, the substrate 10 is disposed on the substrate holder 210 of quartz, and lamps 220 placed over the substrate 10 provide heat to the substrate 10. Alternatively, a plurality of circular lamps may be employed for uniformly heating a substrate having a large size.

A reaction gas including an ammonia gas is provided onto the substrate 10 through the gas supply line 240, thereby forming the oxynitride layer on the substrate 10.

As described above, the oxide layer is formed on the substrate 10 using the batch type apparatus, and then the oxynitride layer is formed on the substrate 10 using the RTN apparatus. Thus, the throughput of the process for forming the oxynitride layer may be increased and the oxynitride layer having a precise thickness may be obtained. In addition, when the oxide layer and/or the oxynitride layer are formed on the substrate, minute patterns of a semiconductor device, for example a DRAM device, an SRAM device or an LOGIC device may be easily formed on the oxide layer or the oxynitride layer. Further, the oxynitride layer prevents the diffusion of the impurities doped in the conductive layer of the semiconductor device, thereby improving the reliability of the semiconductor device.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of forming an oxide layer on a substrate comprising:
   loading a substrate into a reaction chamber having a first pressure and a first temperature; and
   primarily oxidizing the substrate to form a primary oxide layer directly on the substrate, the primarily oxidizing comprising providing a reaction gas onto the substrate while increasing a temperature of the reaction chamber from the first temperature to a second temperature under a second pressure, the primary oxide layer directly on the substrate being completely formed during the increase in temperature from the first temperature to the second temperature wherein the second pressure differs from the first pressure.

2. The method of claim 1, wherein the first pressure is in a range of about 0.03 to about 3.0 Torr, and the first temperature is in a range of about 300 to about 550° C.

3. The method of claim 1, wherein the second pressure is in a range of about 0.3 to about 20 Torr, and the second temperature is in a range of about 550 to about 950° C.

4. The method of claim 1, wherein the temperature of the reaction chamber is increased from the first temperature to the second temperature at a rate of about 2 to about 15° C./minute.

5. The method of claim 1, wherein the reaction gas comprises an oxygen ($O_2$) gas.

6. The method of claim 5, wherein the reaction gas further comprises a hydrogen ($H_2$) gas.

7. The method of claim 5, wherein the reaction gas further comprises a hydrogen chloride (HCl) gas.

8. The method of claim 1, further comprising:
   cooling the primarily oxidized substrate while decreasing the temperature of the reaction chamber from the second temperature to a third temperature under a third pressure; and
   unloading the substrate from the reaction chamber.

9. The method of claim 8, wherein the third pressure is greater than the second pressure.

10. The method of claim 8, wherein the third temperature is greater than the first temperature.

11. The method of claim 8, wherein the temperature of the reaction chamber is decreased from the second temperature to the third temperature at a rate of about 2 to about 15° C./minute.

12. The method of claim 1, further comprising unloading the primarily oxidized substrate from the reaction chamber at the second temperature and a third pressure.

13. The method of claim 12, wherein the second temperature is in a range of about 600 to about 750° C.

14. The method of claim 1, further comprising secondarily oxidizing the primarily oxidized substrate in the reaction chamber when the reaction chamber is at the second temperature and the second pressure.

15. The method of claim 14, further comprising unloading the secondarily oxidized substrate from the reaction chamber when the reaction chamber is at a third pressure and the second temperature.

16. The method of claim 14, further comprising:
   cooling the secondarily oxidized substrate in the reaction chamber while decreasing the temperature of the reaction chamber from the second temperature to a third temperature under the second pressure; and
   unloading the substrate from the reaction chamber.

17. The method of claim 1, further comprising nitrifying the primarily oxidized substrate in the reaction chamber after the reaction chamber has the second pressure and the second temperature.

18. A method of forming an oxide layer on a substrate comprising:
   loading a substrate into a reaction chamber having a first temperature and a first pressure; and
   primarily oxidizing the substrate to form a primary oxide layer directly on the substrate, the primarily oxidizing comprising providing a reaction gas onto the substrate while increasing a temperature of the reaction chamber from the first temperature to a second temperature under a second pressure of about 0.3 to about 20 Torr, the primary oxide layer directly on the substrate being completely formed during the increase in temperature from the first temperature to the second temperature, wherein the second pressure differs from the first pressure.

19. The method of claim 18, further comprising secondarily oxidizing the substrate in the reaction chamber when the reaction chamber is at the second temperature and the pressure.

20. A method forming an oxide layer on a substrate comprising:
   loading a substrate into a reaction chamber having a first pressure and a first temperature; and
   primarily oxidizing the substrate to form a primary oxide layer directly on the substrate, the primarily oxidizing comprising providing a reaction gas including an oxygen gas and a hydrogen gas onto the substrate while increasing a temperature of the reaction chamber from the first temperature to a second temperature under a second pressure, the primary oxide layer directly on the substrate being completely formed during the increase in temperature from the first temperature to the second temperature, wherein the second pressure differs from the first pressure.

21. The method of claim 20, further comprising secondarily oxidizing the primarily oxidized substrate in the reaction chamber when the reaction chamber is at the second pressure and the second temperature.

22. A method of forming an oxide layer comprising:
   loading a substrate into a reaction chamber having a first pressure and a first temperature;
   primarily oxidizing the substrate to form a primary oxide layer directly on the substrate, the primarily oxidizing comprising providing a first reaction gas including an oxygen gas and a hydrogen gas onto the substrate while increasing a temperature of the reaction chamber from the first temperature to a second temperature under a second pressure, the primary oxide layer directly on the substrate being completely formed during the increase in temperature from the first temperature to the second temperature; and secondarily oxidizing the primarily oxidized substrate by providing a second reaction gas including an oxygen gas onto the primarily oxidized substrate while increasing the temperature of the reaction chamber from the second temperature to a third temperature under the second pressure, wherein the second pressure differs from the first pressure.

23. The method of claim 22, wherein the second reaction gas further comprises a hydrogen chloride gas.

24. The method of claim 22, further comprising tertiarily oxidizing the secondarily oxidized substrate in the reaction chamber when the reaction chamber is at the second pressure and a third temperature.

* * * * *